(12) United States Patent
Millward et al.

(10) Patent No.: US 8,450,418 B2
(45) Date of Patent: May 28, 2013

(54) METHODS OF FORMING BLOCK COPOLYMERS, AND BLOCK COPOLYMER COMPOSITIONS

(75) Inventors: Dan B. Millward, Boise, ID (US); Scott E. Sills, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/618,480

(22) Filed: Sep. 14, 2012

(65) Prior Publication Data

US 2013/0017335 A1    Jan. 17, 2013

Related U.S. Application Data

(62) Division of application No. 12/859,869, filed on Aug. 20, 2010, now Pat. No. 8,304,493.

(51) Int. Cl.
*C08F 299/08* (2006.01)
*C08F 299/00* (2006.01)

(52) U.S. Cl.
USPC ............................ 525/105; 525/50; 525/203

(58) Field of Classification Search
None
See application file for complete search history.

(56) References Cited

U.S. PATENT DOCUMENTS

| | | | |
|---|---|---|---|
| 3,483,270 A | 12/1969 | Bostick | |
| 3,665,052 A | 5/1972 | Saam et al. | |
| 3,691,257 A | 9/1972 | Kendrick et al. | |
| 4,623,674 A | 11/1986 | Bailey | |
| 4,877,647 A | 10/1989 | Klabunde | |
| 5,281,666 A | 1/1994 | Hoxmeier | |
| 5,328,810 A | 7/1994 | Lowrey et al. | |
| 5,374,367 A | 12/1994 | Edamura et al. | |
| 5,382,373 A | 1/1995 | Carlson | |
| 5,482,656 A | 1/1996 | Hiraoka et al. | |
| 5,512,131 A | 4/1996 | Kumar et al. | |
| 5,538,655 A | 7/1996 | Fauteux et al. | |
| 5,622,668 A | 4/1997 | Thomas et al. | |
| 5,834,583 A | 11/1998 | Hancock et al. | |
| 5,849,810 A | 12/1998 | Mueller et al. | |
| 5,879,582 A | 3/1999 | Havelka et al. | |
| 5,891,356 A | 4/1999 | Inoue et al. | |
| 5,904,824 A | 5/1999 | Oh et al. | |

(Continued)

FOREIGN PATENT DOCUMENTS

| | | |
|---|---|---|
| CN | 1562730 A | 1/2005 |
| EP | 0784543 B1 | 4/2000 |

(Continued)

OTHER PUBLICATIONS

Park, Dae-Ho, "The Fabrication of Thin Films with Nanopores and Nanogrooves from Block Copolymer Thin Films on the Neutral Surface of Self-assembled Monolayers," Nanotechnology 18, 2007, 355304, IIOP Publishing LTD, UK, pp. 1-7.

(Continued)

*Primary Examiner* — Robert S Loewe
(74) *Attorney, Agent, or Firm* — TraskBritt

(57) ABSTRACT

Methods of modifying block copolymers to enhance thermodynamic properties thereof without sacrificing material properties and methods of forming modified block copolymers having desired properties are disclosed. The modified block copolymers may be used, for example, as a mask for sublithographic patterning during various stages of semiconductor device fabrication. For example, block copolymers having desirable material properties, such as etch selectively, may be chemically modified to tailor a $\chi$ value thereof to optimize the process conditions for achieving a self-assembled state and to reduce a defectivity of the self-assembled block copolymer pattern.

19 Claims, 3 Drawing Sheets

U.S. PATENT DOCUMENTS

| | | | |
|---|---|---|---|
| 5,925,259 A | 7/1999 | Biebuyck et al. |
| 5,929,147 A | 7/1999 | Pierick et al. |
| 5,948,470 A | 9/1999 | Harrison et al. |
| 6,111,323 A | 8/2000 | Carter et al. |
| 6,136,872 A | 10/2000 | Hoxmeier et al. |
| 6,143,647 A | 11/2000 | Pan et al. |
| 6,160,045 A | 12/2000 | Hoxmeier et al. |
| 6,174,968 B1 | 1/2001 | Hoxmeier |
| 6,225,390 B1 | 5/2001 | Hoxmeier |
| 6,235,446 B1 | 5/2001 | Ikemura et al. |
| 6,258,891 B1 | 7/2001 | Hoxmeier |
| 6,270,946 B1 | 8/2001 | Miller |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,423,465 B1 | 7/2002 | Hawker et al. |
| 6,503,841 B1 | 1/2003 | Criscuolo et al. |
| 6,506,660 B2 | 1/2003 | Holmes et al. |
| 6,548,830 B1 | 4/2003 | Noguchi et al. |
| 6,565,763 B1 | 5/2003 | Asakawa et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,579,948 B1 | 6/2003 | Tan et al. |
| 6,610,765 B1 | 8/2003 | Pfaendner et al. |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,824,881 B2 | 11/2004 | Lautenschlager et al. |
| 6,884,842 B2 | 4/2005 | Soane et al. |
| 6,890,624 B1 | 5/2005 | Kambe et al. |
| 6,890,703 B2 | 5/2005 | Hawker et al. |
| 6,894,114 B2 | 5/2005 | Kato et al. |
| 6,908,861 B2 | 6/2005 | Sreenivasan et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,946,332 B2 | 9/2005 | Loo et al. |
| 6,949,456 B2 | 9/2005 | Kumar |
| 6,957,608 B1 | 10/2005 | Hubert et al. |
| 6,962,823 B2 | 11/2005 | Empedocles et al. |
| 6,989,426 B2 | 1/2006 | Hu |
| 6,992,115 B2 | 1/2006 | Hawker et al. |
| 6,998,152 B2 | 2/2006 | Uhlenbrock |
| 7,030,495 B2 | 4/2006 | Colburn et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,077,992 B2 | 7/2006 | Sreenivasan et al. |
| 7,090,784 B2 | 8/2006 | Asakawa et al. |
| 7,115,525 B2 | 10/2006 | Abatchev et al. |
| 7,115,995 B2 | 10/2006 | Wong |
| 7,118,784 B1 | 10/2006 | Xie |
| 7,132,370 B2 | 11/2006 | Paraschiv et al. |
| 7,135,144 B2 | 11/2006 | Christel et al. |
| 7,135,388 B2 | 11/2006 | Ryu et al. |
| 7,135,523 B2 | 11/2006 | Ho et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,202,308 B2 | 4/2007 | Boussand et al. |
| 7,252,791 B2 | 8/2007 | Wasserscheid et al. |
| 7,259,101 B2 | 8/2007 | Zurcher et al. |
| 7,282,240 B1 | 10/2007 | Jackman et al. |
| 7,291,284 B2 | 11/2007 | Mirkin et al. |
| 7,326,514 B2 | 2/2008 | Dai et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,384,852 B2 | 6/2008 | Yang et al. |
| 7,407,887 B2 | 8/2008 | Guo |
| 7,408,186 B2 | 8/2008 | Merkulov et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,592,247 B2 | 9/2009 | Yang et al. |
| 7,605,081 B2 | 10/2009 | Yang et al. |
| 7,632,544 B2 | 12/2009 | Ho et al. |
| 7,678,847 B2 | 3/2010 | Yan et al. |
| 7,767,099 B2 | 8/2010 | Li et al. |
| 8,083,953 B2 | 12/2011 | Millward et al. |
| 8,101,261 B2 | 1/2012 | Millward et al. |
| 8,114,300 B2 | 2/2012 | Millward |
| 2002/0055239 A1 | 5/2002 | Tuominen et al. |
| 2002/0158342 A1 | 10/2002 | Tuominen et al. |
| 2003/0077452 A1 | 4/2003 | Guire et al. |
| 2003/0091752 A1 | 5/2003 | Nealey et al. |
| 2003/0100822 A1 | 5/2003 | Lew et al. |
| 2003/0143375 A1 | 7/2003 | Noguchi et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski et al. |
| 2003/0235930 A1 | 12/2003 | Bao et al. |
| 2004/0028875 A1 | 2/2004 | Van Rijn et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu et al. |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0100830 A1 | 5/2005 | Xu et al. |
| 2005/0124135 A1 | 6/2005 | Ayazi et al. |
| 2005/0147841 A1 | 7/2005 | Tavkhelidze |
| 2005/0167651 A1 | 8/2005 | Merkulov et al. |
| 2005/0208752 A1 | 9/2005 | Colburn et al. |
| 2005/0238889 A1 | 10/2005 | Iwamoto et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0105562 A1 | 5/2006 | Yi |
| 2006/0124467 A1 | 6/2006 | Ho et al. |
| 2006/0134556 A1 | 6/2006 | Nealey et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai et al. |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |

| | | | | | | |
|---|---|---|---|---|---|---|
| 2006/0257633 | A1 | 11/2006 | Inoue et al. | JP | 2005008882 | 7/2006 |
| 2006/0258159 | A1 | 11/2006 | Colburn et al. | JP | 2008036491 | 2/2008 |
| 2006/0278158 | A1 | 12/2006 | Tolbert et al. | TW | 200400990 | 3/1992 |
| 2006/0281266 | A1 | 12/2006 | Wells | TW | 200740602 | 1/1996 |
| 2006/0286305 | A1 | 12/2006 | Thies et al. | TW | 200419017 | 10/2004 |
| 2006/0286490 | A1 | 12/2006 | Sandhu et al. | TW | 200511364 | 3/2005 |
| 2006/0292369 | A1 | 12/2006 | Rutledge et al. | TW | 256110 | 6/2006 |
| 2006/0292777 | A1 | 12/2006 | Dunbar | TW | 1253456 | 11/2007 |
| 2007/0020749 | A1 | 1/2007 | Nealey et al. | WO | 2007024241 | 0/3200 |
| 2007/0023247 | A1 | 2/2007 | Ulicny et al. | WO | 90007575 | 7/1990 |
| 2007/0023805 | A1 | 2/2007 | Wells et al. | WO | 9706013 | 2/1997 |
| 2007/0045562 | A1 | 3/2007 | Parekh | WO | 9839645 | 9/1998 |
| 2007/0071881 | A1 | 3/2007 | Chua et al. | WO | 9947570 | 9/1999 |
| 2007/0072403 | A1 | 3/2007 | Sakata | WO | 0031183 | 6/2000 |
| 2007/0122932 | A1 | 5/2007 | Kodas et al. | WO | 02081372 | 10/2002 |
| 2007/0138131 | A1 | 6/2007 | Burdinski | WO | 2005122285 A2 | 12/2005 |
| 2007/0161237 | A1 | 7/2007 | Lieber et al. | WO | 2006076016 | 7/2006 |
| 2007/0175859 | A1 | 8/2007 | Black et al. | WO | 2006078952 | 7/2006 |
| 2007/0181870 | A1 | 8/2007 | Libertino et al. | WO | 2007001294 | 1/2007 |
| 2007/0200477 | A1 | 8/2007 | Tuominen et al. | WO | 2007013889 A2 | 2/2007 |
| 2007/0208159 | A1 | 9/2007 | McCloskey et al. | WO | 2007019439 A3 | 2/2007 |
| 2007/0218202 | A1 | 9/2007 | Ajayan et al. | WO | 2007024323 A2 | 3/2007 |
| 2007/0222995 | A1 | 9/2007 | Lu | WO | 2007055041 | 5/2007 |
| 2007/0224819 | A1 | 9/2007 | Sandhu | WO | 2008091741 A2 | 7/2008 |
| 2007/0227383 | A1 | 10/2007 | Decre et al. | WO | 2008096335 A2 | 8/2008 |
| 2007/0249117 | A1 | 10/2007 | Kang et al. | WO | 2008097736 A2 | 8/2008 |
| 2007/0281220 | A1 | 12/2007 | Sandhu et al. | WO | 2008118635 A2 | 10/2008 |
| 2007/0289943 | A1 | 12/2007 | Lu et al. | WO | 2008124219 A2 | 10/2008 |
| 2007/0293041 | A1 | 12/2007 | Yang | WO | 2008130847 A1 | 10/2008 |
| 2008/0032238 | A1 | 2/2008 | Lu et al. | WO | 2008145268 A1 | 12/2008 |
| 2008/0083991 | A1 | 4/2008 | Yang et al. | WO | 2008156977 A2 | 12/2008 |
| 2008/0093743 | A1 | 4/2008 | Yang et al. | WO | 2009099924 A2 | 8/2009 |
| 2008/0103256 | A1 | 5/2008 | Kim et al. | WO | 2009102551 A2 | 8/2009 |
| 2008/0164558 | A1 | 7/2008 | Yang et al. | WO | 2009117238 A2 | 9/2009 |
| 2008/0176767 | A1 | 7/2008 | Millward | WO | 2009117243 A1 | 9/2009 |
| 2008/0193658 | A1 | 8/2008 | Millward | WO | 2009134635 A2 | 11/2009 |
| 2008/0217292 | A1 | 9/2008 | Millward et al. | | | |
| 2008/0226995 | A1 | 9/2008 | Costanzo | | | |
| 2008/0233323 | A1 | 9/2008 | Cheng et al. | | | |
| 2008/0257187 | A1 | 10/2008 | Millward | | | |
| 2008/0260941 | A1 | 10/2008 | Jin | | | |
| 2008/0269366 | A1 | 10/2008 | Shaffer et al. | | | |
| 2008/0274413 | A1 | 11/2008 | Millward | | | |
| 2008/0286659 | A1 | 11/2008 | Millward | | | |
| 2008/0311347 | A1 | 12/2008 | Millward et al. | | | |
| 2008/0311402 | A1 | 12/2008 | Jung et al. | | | |
| 2008/0315270 | A1 | 12/2008 | Marsh et al. | | | |
| 2008/0318005 | A1 | 12/2008 | Millward | | | |
| 2009/0041995 | A1 | 2/2009 | Fairclough et al. | | | |
| 2009/0062470 | A1 | 3/2009 | Millward et al. | | | |
| 2009/0087664 | A1 | 4/2009 | Nealey et al. | | | |
| 2009/0155579 | A1 | 6/2009 | Greco et al. | | | |
| 2009/0196488 | A1 | 8/2009 | Nealey et al. | | | |
| 2009/0200646 | A1 | 8/2009 | Millward et al. | | | |
| 2009/0206489 | A1 | 8/2009 | Li et al. | | | |
| 2009/0236309 | A1 | 9/2009 | Millward et al. | | | |
| 2009/0240001 | A1 | 9/2009 | Regner | | | |
| 2009/0263628 | A1 | 10/2009 | Millward | | | |
| 2009/0264317 | A1 | 10/2009 | Ofir et al. | | | |
| 2009/0274887 | A1 | 11/2009 | Millward et al. | | | |
| 2010/0092873 | A1 | 4/2010 | Sills et al. | | | |
| 2010/0102415 | A1 | 4/2010 | Millward et al. | | | |
| 2010/0124826 | A1 | 5/2010 | Millward et al. | | | |
| 2010/0137496 | A1 | 6/2010 | Millward et al. | | | |
| 2010/0163180 | A1 | 7/2010 | Millward | | | |
| 2010/0204402 | A1 | 8/2010 | Millward et al. | | | |
| 2010/0279062 | A1 | 11/2010 | Millward et al. | | | |
| 2010/0292077 | A1 | 11/2010 | Hillmyer et al. | | | |
| 2010/0316849 | A1 | 12/2010 | Millward et al. | | | |
| 2010/0323096 | A1 | 12/2010 | Sills et al. | | | |
| 2011/0097559 | A1 | 4/2011 | Hawker et al. | | | |
| 2012/0046415 | A1 | 2/2012 | Millward et al. | | | |

FOREIGN PATENT DOCUMENTS

| | | |
|---|---|---|
| EP | 1416303 A2 | 5/2004 |
| EP | 1593164 B1 | 6/2010 |
| JP | 11080414 | 3/1999 |
| JP | 2006036923 | 2/2005 |
| JP | 2006055982 | 3/2006 |

OTHER PUBLICATIONS

Park, M., et al., "Block Copolymer Lithography: Periodic Arrays of 1011 Holes in 1 Square Centimeter," Science, vol. 276, No. 5317, May 30, 1997, pp. 1401-1404.

Park, Sang-Min, et al., "Directed assembly of lamellae-forming block copolymers using chemically and topographically patterned substrates," Advanced Materials, vol. 19, No. 4, pp. 607-611, Feb. 2007.

Park, Seung Hak, et al., "Block Copolymer Multiple Patterning Integrated with Conventional ArF Lithography," Soft Matter, 2010, 6, Royal Society of chemistry, pp. 120-125.

Park, Sung Chan, et al., "Controlled Ordering of Block Copolymer Thin Films by the Addition of Hydrophilic Nanoparticles," Macromolecules 2007, vol. 40, No. 22, American Chemical Society, pp. 8119-8124.

Peng, J., et. al., "Development of Nanodomain and Fractal Morphologies in Solvent Annealed Block copolymer Thin Films," Macromol. Rapid Commun. 2007, 28, pp. 1422-1428.

Peters, R. D., et al., "Combining Advanced Lithographic Techniques and Self-assembly of Thin Films of Diblock Copolymers to Produce Templates for Nanofabrication," J. Vac. Sci. Technol. B, vol. 18, No. 6, Nov./Dec. 2000, American Vacuum Society, pp. 3530-3532.

Peters, R. D., et al., "Morphology of Thin Films of Diblock Copolymers on Surfaces Micropatterned with Regions of Different Interfacial Energy," Macromolecules, vol. 35, No. 5, 2002, American Chemical Society, pp. 1822-1834.

Potemkin, Igor I., et al., "Effect of the Molecular Weight of AB Diblock Copolymers on the Lamellar Orientation in Thin Films: Theory and Experiment," Macromol. Rapid Commun., 2007, 28, pp. 579-584.

Ren et al, Synthesis, Characterization, and Interaction Strengths of Difluorocarbene-Modified Polystyrene-Polyisoprene Block Copolymers, Macromolecules vol. 33 (2000) pp. 866-876.

Resnick, D. J., et al., "Initial Study of the Fabrication of Step and Flash Imprint Lithography Templates for the Printing of Contact Holes," Microlith., Microfab., Microsyst., vol. 3, No. 2, Apr. 2004, Society of Photo-Optical Instrumentation Engineers, pp. 316-321.

Rogers, J. A., "Slice and Dice, Peel and Stick: Emerging Methods for Nanostructure Fabrication," ACS Nano, vol. 1, No. 3, 2007, pp. 151-153.

Rozkiewicz, Dorota I., et al., "'Click' Chemistry by Microcontact Printing," Angew. Chem. Int. Ed., vol. 45, pp. 5292-5296, 2006. [Published online Jul. 12, 2006].

Ruiz, R., et al., "Density Multiplication and Improved Lighography by Directed Block Copolymer Assembly," Science, vol. 321, Aug. 15, 2008, pp. 936-939.

Ruiz, R., et al., "Induced Orientational Order in Symmetric Diblock Copolymer Thin-Films," Advanced Materials, vol. 19, No. 4, pp. 587-591, (2007).

Ryu, Du Yeol, et al., "Surface Modification with Cross-Linked Random Copolymers: Minimum Effective Thickness," Macromolecules, vol. 40, No. 12, 2007, American Chemical Society, pp. 4296-4300.

Saraf, Ravi R., et al., "Spontaneous Planarization of Nanoscale Phase Separated Thin Film," Applied Physics Letters, vol. 80, No. 23, Jun. 10, 2002, American Institute of Physics, pp. 4425-4427.

Sawhney, A. S., et al., "Bioerodible Hydrogels Based on Photopolymerized Poly(ethylene glycol)-co-poly(a-hydroxy acid) Diacrylate Macromers," Macromolecules 1993, 26, American Chemical Society, pp. 581-587, Abstract only.

Segalman, R. A., "Patterning with Block Copolymer Thin Films," Materials Science and Engineering R 48 (2005), Elsevier B. V., pp. 191-226.

Shahrjerdi, D., et al., "Fabrication of Ni Nanocrystal Flash Memories Using a Polymeric Self-Assembly Approach," IEEE Electron Device Letters, vol. 28, No. 9, Sep. 2007, pp. 793-796.

Sharma, S. et al., "Ultrathin Poly(ethylene glycol) Films for Silicon-based Microdevices," Applied Surface Science, 206 (2003), Elsevier Science B.V., pp. 218-229.

Sigma-Aldrich, 312-315Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.

Sivaniah, E., et al., "Observation of Perpendicular Orientation in Symmetric Diblock Copolymer Thin Films on Rough Substrates," Macromolecules 2003, 36, American Chemical Society, pp. 5894-5896.

Sivaniah, et al., "Symmetric Diblock Copolymer Thin Films on Rough Substrates, Kinetics and Structure Formation in Pure Block Copolymer Thin Films," Macromolecules 2005, 38, American Chemical Society, pp. 1837-1849.

Solak, H. H., "Nanolithography with Coherent Extreme Ultraviolet Light," Journal of Physics D: Applied Physics, 2006, IOP Publishing Ltd., UK, pp. R171-188.

Srinvivasan, C., et al., "Scanning Electron Microscopy of Nanoscale Chemical Patterns," ACS Nano, vol. 1, No. 3, pp. 191-201, 2007.

Stoykovich, M. P., et al., "Directed Assembly of Block Copolymer Blends into Nonregular Device-Oriented Structures," Science, vol. 308, Jun. 3, 2005, pp. 1442-1446.

Stoykovich, M. P., et al., "Directed Self-Assembly of Block Copolymers for Nanolithography: Fabrication of Isolated Features and Essential Integrated Circuit Geometries," ACS Nano, vol. 1, No. 3, 2007, pp. 168-175.

Sundrani, D., et al., "Guiding Polymers to Perfection: Macroscopic Alignment of Nanoscale Domains," Nano Lett., vol. 4, No. 2, 2004, American Chemical Society, pp. 273-276.

Sundrani, D., et al., "Hierarchical Assembly and Compliance of Aligned Nanoscale Polymer Cylinders in Confinement," Langmuir 2004, vol. 20, No. 12, 2004, American Chemical Society, pp. 5091-5099.

Truskett, V. M., et. al., "Trends in Imprint Lithography for Biological Applications," TRENDS in Biotechnology, vol. 24, No. 7, Jul. 2006, pp. 312-315.

Van Poll, M. L., et al., "A Self-Assembly Approach to Chemical Micropatterning of Poly(dimethylsiloxane)," Angew. Chem. Int. Ed. 2007, 46, pp. 6634-6637.

Wang, C., et al., "One Step Fabrication and characterization of Platinum Nanopore Electrode Ensembles formed via Amphiphilic Block Copolymer Self-assembly," Electrochimica Acta 52 (2006), pp. 704-709.

Wathier, M., et al., "Dendritic Macromers as in Situ Polymerizing Biomaterials for Securing Cataract Incisions," J. Am. Chem. Soc., 2004, 126 (40), pp. 12744-12745, Abstract only.

Winesett, D.A., et al., "Tuning Substrate Surface Energies for Blends of Polystyrene and Poly(methyl methacrylate)," Langmuir 2003, 19, American Chemical Society, pp. 8526-8535.

WIPF, "Handbook of Reagents for Organic Synthesis", 2005, John Wiley & Sons Ltd., p. 320.

Wu, C.Y., et al., "Self-Assembled Two-Dimensional Block Copolymers on Pre-patterned Templates with Laser Interference Lithography," IEEE, 2007, pp. 153-154.

Xiao, Shuaigang., et al., "Graphoepitaxy of Cylinder-forming Block Copolymers for Use as Templates to Pattern Magnetic Metal Dot Arrays," Nanotechnology 16, IPO Publishing Ltd, UK (2005), pp. S324-S329.

Xu, Ting, et al., "The Influence of Molecular Weight on Nanoporous Polymer Films," Polymer 42, Elsevier Science Ltd., (2001) pp. 9091-9095.

Yamaguchi, T., et al., "Resist-Pattern Guided Self-Assembly of Symmetric Diblock Copolymer," Journal of Photopolymer Science and Technology, vol. 19, No. 3, pp. 385-388 (2006).

Yamaguchi, Toru, et al., "Two-dimensional Arrangement of Vertically Oriented Cylindrical Domains of Diblock Copolymers Using Graphoepitaxy with Artificial Guiding Pattern Layout," Microprocesses and Nanotechnology, 2007, Conference date Nov. 5-8, 2007, pp. 434-435.

Yan, Xiaohu, et al., "Preparation and Phase Segregation of Block Copolymer Nanotube Multiblocks," J. Am. Chem. Soc., vol. 126, No. 32, 2004, American Chemical Society, pp. 10059-10066.

Yang, Xiao M., et al., "Guided Self-Assembly of Symmetric Diblock Copolymer Films on Chemically Nanopatterned Substrates," Macromolecules 2000, vol. 33, No. 26, 2000, American Chemical Society, pp. 9575-9582.

Yang, Xiaomin, et al., "Nanoscopic Templates Using Self-assembled Cylindrical Diblock Copolymers for Patterned Media," J. Vac. Sci. Technol. B 22(6), Nov./Dec. 2004, American Vacuum Society, pp. 3331-3334.

Yurt, Serkan, et al., "Scission of Diblock Copolymers into Their Constituent Blocks," Macromolecules 2006, vol. 39, No. 5, 2006, American Chemical Society, pp. 1670-1672.

Zehner, R. W., et al., "Selective Decoration of a Phase-Separated Diblock Copolymer with Thiol-Passivated Gold Nanocrystals," Langmuir, vol. 14, No. 2, pp. 241-244, Jan. 20, 1998.

Zhang, Mingfu, et al., "Highly Ordered Nanoporous Thin Films from Cleavable Polystyrene-block-poly(ethylene oxide),"Adv. Mater. 2007, 19, pp. 1571-1576.

Zhang, Yuan, et al., "Phase Change Nanodot Arrays Fabricated Using a Self-Assembly Diblock Copolymer Approach," Applied Physics Letter, 91, 013104, 2007, American Institute of Physics, pp. 013104 to 013104-3.

Zhu, X.Y., et al., "Molecular Assemblies on Silicon Surfaces via Si-O Linkages," Langmuir, vol. 16, 2000, American Chemical Society, pp. 6766-6772. [Published on Web Jul. 29, 2000].

Jung et al., Solvent-Vapor-Induced Tunability of Self-Assembled Block-Copolymer Patterns, Adv.Mater. 2009, vol. 21, pp. 1-6.

Ren et al., Synthesis, Characterization, and Interaction Strengths of Difluorocarbene-Modified Polystyrene-Polyisoprene Block Copolymers, Macromolecules vol. 33 (2000) pp. 866-876.

Singh et al., Manipulating Ordering Transitions in interfacially modified block coplomers, Soft Matter, 2009, vol. 5, pp. 4757-4762.

Tang et al. "Evolution of Block Copolymer Lithography to Highly Ordered Square Arrays", Science, vol. 322, 2008, 429-432.

Tang et al., Evolution of Block Copolymer Lithograpy to Highly Ordered Square Arrays, Scienceexpress, www.scienceexpress.org, Sep. 25, 2008, 4 pages.

Tang et al., Supporting Material for "Evolution of Block Copolymer Lithography to Highly Ordered Square Arrays" 2008, 9 pages.

www.hitachiGST.Com, Density Multiplication and Improved Lithography by Direted Block Copolymer Assembly for Patterned Media at 1Tbit/in2 and Beyond, Hitachi Global Storage Technologies, 2008, 3 pages.

He, Yiyong, et al., "Self-Assembly of Block Copolymer Micelles in an Ionic Liquid," J. Am. Chem. Soc. 2006, 128, pp. 2745-2750. He, Yiyong et al., "Self-Assembly of Block Copolymer Micelles in an Ionic Liquid," J. Am. Chem. Soc. 2006, 128, pp. 2745-2750.

Helmbold, A., et al., "Optical Absorption of Amorphous Hydrogenated Carbon Thin Films," Thin Solid Films 283 (1996) pp. 196-203.

Hermans, T. M., et al., "Application of Solvent-Directed Assembly of Block Copolymers to the Synthesis of Nanostructured Materials with Low Dielectric Constants", Angewandte Chem. Int. Ed., vol. 45, Issue 40, Oct. 13, 2006, pp. 6648-6652.

Hutchison, J. B, et al., "Polymerizable Living Free Radical Initiators as a Platform to Synthesize Functional Networks," Chem. Mater., vol. 17, No. 19, 2005, pp. 4789-4797.

Ikeda, Susumu, et al., "Control of Orientation of Thin Films of Organic Semiconductors by Graphoepitaxy," NanotechJapan Bulletin—vol. 3, No. 3, Dec. 17, 2010/Focus 26-06, NIMS International Center for Nanotechnology Network.

In, Insik, et al., "Side-Chain-Grafted Random Copolymer Brushes as Neutral Surfaces for Controlling the Orientation of Block Copolymer Microdomains in Thin Films," Langmuir, vol. 22, No. 18, 2006, Department of Materials Science and Engineering and Chemical and Biological Engineering, Univ. of Wisconsin-Madison, pp. 7855-7860.

Ji, Shengxiang, et al., "Generalization of the Use of Random Copolymers to Control the Wetting Behaviors of Block Copolymer Films," Macromolecules, 2008, 41(23): 9098-9103.

Ji, Shengxiang, et al., "Molecular Transfer Printing Using Block Copolymers," ACS Nano, vol. 4, No. 2, 2010, Dept. of Chemical and Biological Engineering, Univ. of Wisconsin, pp. 599-609.

Ji, Shengxiang, et al., "Preparation of Neutral Wetting Brushes for Block Copolymer Films from Homopolymer Blends," submitted to Advanced Materials, 20(16): 3054-3060; published online Jul. 7, 2008.

Jun, Y.,et al., "Microcontact Printing Directly on the Silicon Surface," Langmuir, 2002, 18(9), pp. 3415-3417, Abstract only.

Karim, Alamgir, et al., "Control of Ordering Kinetics and Morphology Using Zone Annealing of Thin Block Copolymer Films", Abstract submitted for the Mar. 2007 Meeting of the American Physical Society, Nov. 20, 2006.

Kim, IS, et al., "Self-assembled Hydrogel Nanoparticles Composed of Dextran and Poly (ethylene glycol) Macromer," Int J Pharm., Sep. 15, 2000; 205(1-2): 109-116, Abstract only.

Kim, Sang Ouk, et al., "Epitaxial Self-assembly of Block Copolymers on Lithographically Defined Nanopatterned Substrates," Nature, vol. 424, Jul. 24, 2003, Dept. of Chemical Engineering and Center for Nanotechnology, and Dept. of Mechanical Engineering, Univ. of Wisconsin, pp. 411-414.

Kim, Sang Ouk, et al., "Novel Complex Nanostructure from Directed Assembly of Block Copolymers on Incommensurate Surface Patterns," Adv. Mater., 2007, 19, pp. 3271-3275.

Kim, Seung Hyun, et al., "Highly Oriented and Ordered Arrays from Block Copolymers via Solvent Evaporation," Adv. Mater. 2004, 16, No. 3, Feb. 3, pp. 226-231.

Kim, Seung Hyun, et al., "Salt Complexation in Block Copolymer Thin Films," Macromolecules 2006, vol. 39, No. 24, 2006, pp. 8473-8479.

Kim, Seung Hyun, et al., "Solvent-Induced Ordering in Thin Film Diblock Copolymer/Homopolymer Mixtures," Advanced Mater., vol. 16, No. 23-24, Dec. 17, 2004, pp. 2119-2123.

Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.

Kim, SH, et al., "Synthesis and characterization of Dextran-methacrylate Hydrogels and Structural Study by SEM," J . Biomater Res., Mar. 15, 2000; 49(4): 517-27 Abstract only.

Kim, Su-Jin, et al., "Hybrid Nanofabrication Processes Utilizing Diblock Copolymer Nanotemplate Prepared by Self-assembled Monolayer Based Surface Neutralization," J. Vac. Sci. Technol. B26(1), Jan./Feb. 2008, © 2008 American Vacuum Society, pp. 189-194.

Knoll, A., et al., "Phase Behavior in Thin Films of Cylinder-Forming Block Copolymers," Physical Review Letters vol. 89, No. 3 Jul. 2002, The American Physical Society, pp. 035501-1 to 035501-4.

Krishnamoorthy, S., et al., "Nanoscale Patterning with Block Copolymers," Materials Today, vol. 9, No. 9, Sep. 2006, pp. 40-47.

La, Young-Hye, et al., "Directed Assembly of Cylinder-Forming Block Copolymers into Patterned Structures to Fabricate Arrays of Spherical Domains and Nanoparticles," Chem. Mater, 2007, vol. 19, No. 18, Department of Chemical and Biological Engineering and Center for Nanotechnology, Univ. of Wisconsin, pp. 4538-4544.

La, Young-Hye, et al., "Pixelated Chemically Amplified Resists: Investigation of Material Structure on the Spatial Distribution of Photoacids and Line Edge Roughness," J. Vac. Sci. Technol. B 25(6), Nov./Dec. 2007, American Vacuum Society, pp. 2508-2513.

Laracuente, A.R., et al., "Step Structure and Surface Morphology of Hydrogen-terminated Silicon: (001) to (114)," Surface Science 545, 2003, pp. 70-84.

Lentz, D, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-10.

Li, Mingqi, et al., "Block Copolymer Patterns and Templates," Materials Today, vol. 9, No. 9, Sep. 2006, pp. 30-39.

Li, Wai-Kin, et al, "Creation of Sub-20-nm Contact Using Diblock Copolymer on a 300 mm Wafer for Complementary Metal Oxide Semiconductor Applications," J. Vac. Sci. Technol. B 25(6), Nov./Dec. 2007, American Vacuum Society, pp. 1982-1984.

Li, Xue, et al."Morphology Change of Asymmetric Diblock Copolymer Micellar Films During Solvent Annealing," ScienceDirect, Polymer 48 (2007), pp. 2434-2443.

Lin, Zhiqun, et al., "A Rapid Route to Arrays of Nanostructures in Thin Films," Adv. Mater. 2002, 14 No. 19, Oct. 2, pp. 1373-1376.

Lin-Gibson, Sheng, et al., "Structure—Property Relationships of Photopolymerizable Poly(ethylene glycol) Dimethacrylate Hydrogels," Macromolecules 2005, 38, American Chemical Society, pp. 2897-2902.

Lutolf, M., et al., "Cell-Responsive Synthetic Hydrogels," Adv. Mater., vol. 15, No. 11, Jun. 2003, pp. 888-892.

Lutolf, M.P., et al., "Synthetic Biomaterials as Instructive Extracellular Microenvironments for Morphogenesis in Tissue Engineering," Nature Biotechnology, 23, 47-55 (2005), Abstract only.

Malkoch, M., et al., "Synthesis of Well-defined Hydrogel Networks Using Click Chemistry," Chem. Commun., 2006, The Royal Society of Chemistry, pp. 2774-2776.

Mansky, P., et al., "Controlling Polymer-Surface Interactions with Random Copolymer Brushes," Science, vol. 275, Mar. 7, 1997, pp. 1458-1460.

Martens, P., et al., "Characterization of Hydrogels Formed from Acrylate Modified Poly(vinyl alcohol) Macromers," Polymer, vol. 41, Issue 21, Oct. 2000, pp. 7715-7722, Abstract only.

Matsuda, T., et al., "Photoinduced Prevention of Tissue Adhesion," ASAIO J, Jul.-Sep. 1992; 38(3): M154-7, Abstract only.

Maye, M. A., et al., "Chemical Analysis Using Force Microscopy," Journal of Chemical Education, vol. 79, No. 2, Feb. 2002, Dept. of Chemistry, State Univ. of New York at Binghamton, USA, pp. 207-210.

Metters, A., et al., "Network Formation and Degradation Behavior of Hydrogels Formed by Michael-Type Addition Reactions," Biomacromolecules 2005, 6, 2005, pp. 290-301.

Meyer, E., et al., "Controlled Dewetting Processes on Microstructured Surfaces—a New Procedure for Thin Film Microstructuring," Macromollecular Mater. Eng., 276/277, 2000, Institute of Polymer Research Dresden, pp. 44-50.

Mezzenga, R., et al., "On the Role of Block Copolymers in Self-Assembly of Dense Colloidal Polymeric Systems," Langmuir 2003, vol. 19, No. 20, 2003, American Chemical Society, pp. 8144-8147.

Mindel, J., et.al., "A Study of Bredig Platinum Sols", The Chemical Laboratories of New York University, vol. 65 pp. 2112.

Naito, K., et al., "2.5-Inch Disk Patterned Media Prepared by an Artificially Assisted Self-Assembling Method," IEEE Transactions on Magnetics, vol. 38, No. 5, Sep. 2002, pp. 1949-1951.

Nealey, P. F., et al., "Self-Assembling Resists for Nanolithography", IEEE 2005, 0-7803-9269-8, 2 pages.

Nguyen, K. T., et al., "Photopolymerizable Hydrogels for Tissue Engineering Applications," Biomaterials 23, 2002, pp. 4307-4314.

Nishikubo, T., "Chemical Modification of Polymers via a Phase-Transfer Catalyst or Organic Strong Base," American Chemical Society Symposium Series, 1997, American Chemical Society, pp. 214-230.

Niu, Sanjun, et al., "Stability of Order in Solvent-Annealed Block Copolymer Thin Films," Macromolecules, vol. 36, No. 7, 2003, Univ. Of Nebraska, USA, pp. 2428-2440, (web release date: Mar. 13, 2003) (http://digitalcommons.uni.edu/cgi/viewcontent.cgi?article+1005&contect=chemeng_nanotechnology).

Olayo-Valles, R., et al., "Large Area Nanolithographic Templates by Selective Etching of Chemically Stained Block Copolymer Thin Films," J. Mater. Chem, 2004, 14, The Royal Society of Chemistry, pp. 2729-2731.

Parejo, P. G., et al., "Highly Efficient UV-absorbing Thin-film Coatings for Protection of Organic Materials Against Photodegradation," J. Mater. Chem., 2006, 16, The Royal Society of Chemistry, pp. 2165-2169.

Park, Cheolmin, et al., "Enabling Nanotechnology with Self Assembled Block Copolymer Patterns," Polymer 44, 2003, pp. 6725-6760.

Ali, H. A., et al., Properties of Self-assembled ZnO Nanostructures, Solid-State Electronics 46 (2002), 1639-1642.

Arshady, R., et al., "The Introduction of Chloromethyl Groups into Styrene-based Polymers, 1," Makromol. Chem., vol. 177, 1976, p. 2911-2918.

Bae, Joonwon, "Surface Modification Using Photo-Crosslinkable Random Copolymers", Abstract submitted for the Mar. 2006 meeting of the American Physical Society, submitted Nov. 30, 2005. (Accessed via the Internet [retrieved on Apr. 5, 2010], URL: http://absimage.aps.org/image/MWS_MAR06-2005-003641.pdf).

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., "The Effect of Humidity on the Ordering of Tri-block Copolymer Thin Films," Abstract submitted for the Mar. 2007 meeting of the American Physical Society, submitted Nov. 20, 2006.

Bass, R. B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.

Bearinger, J. P., et al., "Chemisorbed Poly(propylene sulphide)-based Copolymers Resist Biomolecular Interactions," Nature Materials 2, 259-264, 2003, (published online Mar. 23, 2003). Published online Mar. 23, 2003.

Berry, B. C., et al., "Orientational Order in Block Copolymer Films Zone Annealed Below the Orer—Disorder Transistion Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).

Berry, B. C., et al., "Effects of Zone Annealing on Thin Films of Block Copolymers", National Institute of Standard and Technology, Polymers Division, Maryland, USA, 2007, 2 pages.

Black, C T. et al. "Integration of Self Assembly for Semiconductor Microelectronics," IEEE 2005 Custom Integrated . Circuits Conference, IBM T.J. Watson Research Center, pp. 87-91.

Black, C. T., "Self-aligned self-assembly of multi-nanowire silicon field effect transistors," Appl. Phys. Lett, vol. 87, pp. 163116-1 through 163116-3, 2005.

Black, C. T., "Polymer Self-Assembly as a Novel Extension to Optical Lithography," ACSNano, vol. 1, No. 3, 2007, American Chemical Society, pp. 147-150.

Black, C. T., et al., "High-Capacity, Self-Assembled Metal-Oxide-Semiconductor Decoupling Capacitors," IEEE Electron Device Letters, vol. 25, No. 9, Sep. 2004, pp. 622-624.

Black, C. T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.

Black, C. T., et al., "Self Assembly in Semiconductor Microelectronics: Self-Aligned Sub-Lithographic Patterning Using Diblock Copolymer Thin Films," Proc. of SPIE, vol. 6153, 615302 (2006).

Black, C. T., et al., Polymer Self Assembly in Semiconductor Microelectronics, IBM J. Res. & Dev. vol. 51, No. 5, Sep. 2007, pp. 605-633.

Botelho Do Rego, A. M, et al., "Diblock Copolymer Ultrathin Films Studied by High Resolution Electron Energy Loss Spectroscopy," Surface Science, 482-485 (2001), pp. 1228-1234.

Brydson, R. M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).

Bulpitt, P., et al, "New Strategy for Chemical Modification of Hyaluronic Acid: Preparation of Functionalized Derivatives and Their Use in the Formation of Novel Biocompatible Hydrogels," Journal of Biomedical Materials Research, vol. 47, Issue 2, pp. 152-169, Abstract only.

Canaria, C. A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).

Candau, F., et al., "Synthesis and Characterization of Polystyrene-poly(ethylene oxide) Graft Copolymers," Polymer, 1977, vol. 18, pp. 1253-1257.

Cavicchi, K. A., et al., "Solvent Annealed Thin Films of Asymmetric Polyisoprene—Polylactide Diblock Copolymers," Macromolecules 2007, vol. 40, 2007, Univ. of Massachusetts, pp. 1181-1186.

Cha, J. N., et al., Biomimetic Approaches for Fabricating High-Density Nanopatterned Arrays, Chem. Mater. vol. 19, 2007, pp. 839-843. [Published on Web Jan. 20, 2007].

Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).

Chang, Li-Wen, "Diblock Copolymer Directed Self-Assembly for CMOS Device Fabrication," Proc. Of SPIE, vol. 6156, 2006, 615611-1 to 615611-6.

Chang, Li-Wen, "Experimental Demonstration of Aperiodic Patterns of Directed Self-Assembly of Block Copolymer Lithography for Random Logic Circuit Layout," IEEE International Electron Devices Meeting (IEDM), paper 33.2, Dec. 6-8, San Francisco, 2010, pp. 33.2.1-33.2.4.

Cheng, J. Y., et al., "Rapid Directed Self Assembly of Lamellar Microdomains from a Block Copolymer Containing Hybrid," Applied Physics Letters, 91, 143106-143106-3 (2007).

Cheng, J. Y., et al., "Self-Assembled One-Dimensional Nanostructure Arrays," Nano Letters, vol. 6, No. 9, 2006, pp. 2099-2103.

Cheng, J. Y., et al., "Templated Self-Assembly of Block Copolymers: Effect of Substrate Topography," Adv. Mater. 2003, vol. 15, No. 19, pp. 1599-1602.

Choi, H. J., et al., "Magnetorheology of Synthesized Core—Shell Structured Nanoparticle," IEEE Transactions on Magnetics, vol. 41, No. 10, Oct. 2005, pp. 3448-3450.

Daoulas Kostas CH., et al., "Fabrication of Complex Three-Dimensional Nanostructures from Self-Assembling Block Copolymer Materials on Two-Dimensional Chemically Patterned Templates with Mismatched Symmetry," Physical Review Letters 96, week ending Jan. 27, 2006, pp. 036104-1-3.

Darling, S. B., "Directing the Self-assembly of Block Copolymers," Progress in Polymer Science, vol. 32, No. 10, Sep. 28, 2007, pp. 1152-1204.

Desai, DR. Trejal A., et al., "Engineered Silicon Surfaces for Biomimetic Interfaces," Business Briefing: Medical Device Manufacturing & Technology, 2002.

Edwards, E. W., et al., "Mechanism and Kinetics of Ordering in Diblock Copolymer Thin Films on Chemically Nanopatterned Substrates," Journal of Polymer Science: Part B Polymer Physics, vol. 43, 3444-3459, 2005.

Edwards, E. W., et al., "Precise Control over Molecular Dimensions of Block-Copolymer Domains Using the Interfacial Energy of Chemically Nanopatterned Substrates," Advanced Mater., 16, No. 15, Aug. 4, 2004, pp. 1315-1319.

Elisseeff, J., et al., "Photoencapsulation of Chondrocytes in Poly(ethylene oxide)-based Semi-interpenetrating Networks," Journal of Biomedical Materials Research, 51(2): 164-171, Aug. 2000, Abstract only.

Fasolka, M. J. et al., "Morphology of Ultrathin Supported Diblock Copolymer Films: Theory and Experiment," Macromolecules 2000, vol. 33, No. 15, pp. 5702-5712.

Fukunaga, K., et al., "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006, pp. 6171-6179.

Gates, B. D., et al., "Unconventional Nanofabrication," Annu. Rev. Mater. Res. 2004, 34:339-72.

Ge, Zhenbin, et al., "Thermal Conductance of Hydrophilic and Hydrophobic Interfaces," PRL 96, 186101-1-186101-4, The American Physical Society, week ending May 12, 2006.

Gelest Inc., "Silane Coupling Agents: Connecting Across Boundaries," v2.0, 2006, pp. 1-56.

Genua, A., et al., "Functional Patterns Obtained by Nanoimprinting Lithography and Subsequent Growth of Polymer Brushes," Nanotechnology, 18, (2007), IOP Publishing Ltd., pp. 1-7.

Gillmor, S. D., et al., "Hydrophilic/Hydrophobic Patterned Surfaces as Templates for DNA Arrays," Langmuir 2000, vol. 16, No. 18, 2000, pp. 7223-7228.

Gudipati, C. S., et al., "Hyperbranched Fluoropolymer and Linear Poly(ethylene glycol) Based Amphiphilic Crosslinked Networks as Efficient Antifouling Coatings: An Insight into the Surface Compositions, Topographies, and Morphologies," Journal of Polymer Science Part A: Polymer Chemistry, vol. 42, (2004), pp. 6193-6208.

Guo, Kai, et al., Abstract of "Synthesis and Characterization of Novel Biodegradable Unsaturated Poly(ester amide)/ Poly(ethylene glycol) Diacrylate Hydrogels", Journal of Polymer Science Part A: Polymer Chemistry, vol. 43, Issue 17, 2005 Wiley Periodicals, Inc., pp. 3932-3944.

Hamley, I. W., "Introduction to Block Copolymers", Developments in Block Copolymers Science and Technology, John Wiley & Sons, Ltd., 2004, pp. 1-29.

Hammond, M. R., et al., "Temperature Dependence of Order, Disorder, and Defects in Laterally Confined Diblock Copolymer Cylinder Monolayers," Macromolecules, vol. 38, Jul. 2005; American Chemical Society, p. 6575-6585.

Harrison, C., et al., "Layer by Layer Imaging of Diblock Copolymer Films with a Scanning Electron Microscope," Polymer, vol. 39, No. 13, 1998, pp. 2733-2744.

Hawker, C. J., et al., "Facile Synthesis of Block Copolymers for Nanolithographic Applications," Polymer Reprints, American Chemical Society (2005).

Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.

METHODS OF FORMING BLOCK COPOLYMERS, AND BLOCK COPOLYMER COMPOSITIONS

CROSS-REFERENCE TO RELATED APPLICATION

This application is a divisional of U.S. patent application Ser. No. 12/859,869, filed Aug. 20, 2010, now U.S. Pat. No. 8,304,493, issued Nov. 6, 2012, the disclosure of which is hereby incorporated herein in its entirety by this reference.

TECHNICAL FIELD

The invention, in various embodiments, relates generally to methods for modifying block copolymers to change a Flory-Huggins interaction parameter ($\chi$ value or Chi) thereof, and to modified block copolymers having at least one of a $\chi$ value, a physical property and a chemical property suitable for use in sub-lithographic patterning.

BACKGROUND

The cost per die of electronic components is reduced significantly as feature size becomes smaller. As device feature sizes become smaller, conventional lithographic processes become increasingly more difficult and expensive. Therefore, significant challenges are encountered in the fabrication of nanostructures, particularly structures having a feature size of less than a resolution limit of immersion photolithography (about 50 nm).

It is possible to fabricate isolated or semi-dense structures at this scale using a conventional lithographic process, such as shadow mask lithography and e-beam lithography. However, such processes are limited because the exposure tools are extremely expensive or extremely slow and, further, may not be amenable to formation of structures having dimensions of less than 50 nm.

The development of new lithographic processes, as well as materials useful in such processes, is of increasing importance in making fabrication of small-scale devices easier, less expensive, and more versatile. One example of a method of fabricating small-scale devices that addresses some of the drawbacks of conventional lithographic techniques is block copolymer lithography, where use is made of polymer masks derived from self-assembly of block copolymers. Block copolymers are known to form nano-scale microdomains by microphase segregation. In the fabrication of the block copolymer, the microdomains may rearrange into a self-assembled array by microphase segregation to achieve a thermodynamic equilibrium state by, for example, treating the block copolymer with at least one of heat and a solvent. When cast on a substrate and treated, block copolymers form nano-scale periodic patterns that may be useful as an etch mask in semiconductor device fabrication. Such ordered patterns of isolated structural units formed by the self-assembled block copolymers may potentially be used for fabricating periodic structural units and, therefore, have promising applications in, for example, semiconductor, optical, and magnetic devices. Dimensions of the structural units so formed are typically in the range of 5 nm to 50 nm, which dimensions are extremely difficult to define using conventional lithographic techniques. The size and shape of these domains may be dominated by controlling the molecular weight and composition of the block copolymer. Additionally, the interfaces between these domains have widths on the order of 1 nm to 5 nm and may be controlled by changing the chemical composition of the blocks of the copolymers.

An important factor in determining microphase segregation behavior in block copolymers for self-assembled lithography is the Flory-Huggins interaction parameter ($\chi$ value), which indicates an energetic penalty of dissolving one block into the other block. Accordingly, the $\chi$ value of a block copolymer defines a tendency of the block copolymer to segregate into microdomains as a function of the block copolymer's weight, chain length, and/or degree of polymerization. Chi has the generic relationship of $\chi=a+b/T$, where T is a processing temperature and wherein a and b are material-specific values dependent on the block polymers. The $\chi$ value, the degree of polymerization (i.e., a number of monomer repeats in a block copolymer chain) (N), and the composition ($\Phi$) of a block copolymer dictate the phase behavior of the block copolymer. The $\chi$ value of a block copolymer has ramifications on both the kinetics of self-assembly and the thermodynamic equilibrium state of the block copolymer. Microphase segregation occurs above a certain value of $\chi N$, where N is the number of monomer repeats in a block copolymer chain. If $\chi N$ of a block copolymer is less than or equal to about 10, the disordered state has a lower free energy than the ordered state and the block copolymer domains do not phase separate. When $\chi N$ is greater than about 10, the ordered state has lower free energy and the block copolymer domains phase separate into a variety of ordered periodic microstructures dependent on the volume fractions of each domain.

Materials with a greater $\chi$ value microphase segregate at a smaller chain length, yielding patterns with a smaller period. The width of an interface between the microdomains of the block polymer is given by $\alpha\chi^{-1/2}$, where $\alpha$ is the statistical segment length, implying that a block copolymer with a greater $\chi$ value may have sharper and more distinct boundaries between the microdomains. Improved boundaries may result in a decrease in line edge roughness in features patterned using the segregated block copolymer. Since block copolymers having increased $\chi$ values between the polymer blocks thereof may provide arrays having reduced periodicity and increasingly smooth interfaces between microdomains, such block copolymers may enable formation of smaller features having reduced line edge roughness in semiconductor device fabrication. The accessible $\chi$ value of the block copolymer falls within a discrete range determined by a processing temperature range of the block copolymer (i.e., a temperature in a range of greater than or equal to a glass transition temperature ($T_g$) of the block copolymer and less than a decomposition temperature of the block copolymer).

However, a block copolymer having desired physical properties (i.e., one block inherently having etch selectivity over the other block) may not possess desirable processing qualities such as equilibrium defect density and annealing time (i.e., the time required to reach equilibrium self-assembled state), because of a limited range of accessible $\chi$ values. The mechanism for reaching equilibrium from a defect-ridden, as-cast state (i.e., defect reduction) requires movement of one block through the other so that the polymer chains may be positioned in lower energy configurations. The rate of this process decreases as the $\chi$ value increases and, thus, large $\chi N$ values of a block copolymer may result in undesirable increases in the length of time for microphase segregation of the block copolymer to occur. Therefore, in block copolymers having large $\chi N$ values, it is increasingly difficult to produce a self-assembled film having a tolerable equilibrium defect density within an acceptable time period for efficient fabrication of the semiconductor device.

For example, poly(styrene-b-dimethylsiloxane) block copolymer (PS-b-PDMS), exhibits desirable properties for use in lithographic techniques. PS-b-PDMS is a diblock polymer that includes polystyrene blocks and polydimethylsiloxane blocks. The chemical structure of PS-b-PDMS is shown in FIG. 1, where n represents a number of repeats of styrene in the polystyrene blocks and m represents a number of repeats of dimethylsiloxane in the polydimethylsiloxane blocks. PS-b-PDMS has a high χ value in comparison to other block copolymers that provides a high degree of phase separation as well as an etch-resistant PDMS block. Solvent vapor annealing has been used to speed up self-assembly time for the PS-b-PDMS. However, solvent vapor annealing may be difficult to perform and may results in an increase in defects specific to the solvent vapor annealing process in the ordered microdomains formed from the PS-b-PDMS.

DETAILED DESCRIPTION

Figure 1:
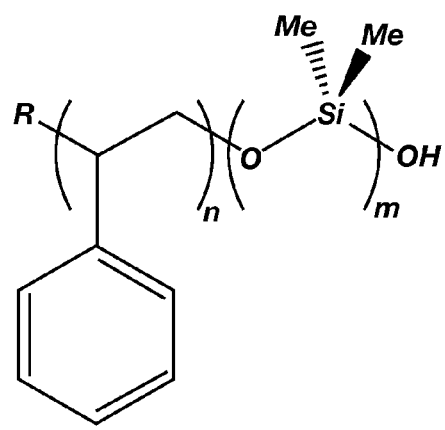
FIG. 1 is a chemical structure of a known block copolymer (i.e., a polystyrene-block-polydimethylsiloxane (PS-b-PDMS) copolymer)

As used herein, the term "modified" means and includes a material in which at least one of the monomer units is replaced by another substituent, providing a change in chemical and physical properties, such as the χ value, domain selectivity, developability and preferential wetting.

The term "graft polymer," as used herein, means and includes a polymer that includes a main polymer block and at least one side polymer segment as a branch in a side chain of the main polymer block. The at least one side polymer segment may be structurally distinct from the main polymer block. A graft polymer is represented herein as $(A_n\text{-g-}A'_m)\text{-b-}B_p$, wherein A represents a polymer segment, A' represents a modified polymer segment A, and each of n, p and r represent a number of repeats.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a χN value with other polymer blocks of unlike monomer types that is sufficient for phase separation to occur. For example, the χN value of one polymer block with at least one other polymer blocks in the larger polymer may be greater than about 10.

As used herein, the term "polymer segment" means and includes a grouping of multiple monomer units of a single type (i.e., a homopolymer segment) or multiple types (i.e., a copolymer segment) of constitutional units into a continuous region of a polymer block that are of a length that is insufficient for microphase separation to inherently occur with other segments in the same block type.

As used herein, the term "block copolymer" means and includes a polymer composed of chains where each chain contains two or more polymer blocks as defined above and at least two of the blocks are of sufficient segregation strength (e.g., χN>10) for those blocks to phase separate. A wide variety of block polymers are contemplated herein including diblock copolymers (i.e., polymers including two polymer blocks), triblock copolymers (i.e., polymers including three polymer blocks), multiblock copolymers (i.e., polymers including more than three polymer blocks), and combinations thereof.

As used herein, the terms "alternating" or "substantially alternating" mean and include two or more different monomers arranged in succession in a polymer segment so that the monomers form a pattern in which the different monomers interchange repeatedly and regularly with one another. As used therein, the term "alternating polymer block" means and includes a modified polymer block including one or more polymer segments, each including a monomer and a modified monomer alternating in repeating succession. An alternating polymer block is represented herein as $(A_n\text{-b-}A'_p)_r$, wherein A represents a polymer segment, A' represents a modifying polymer segment, and each of n, p and r represent the number of repeats.

As used herein, the terms "random" or "substantially random" mean and include two or more different monomers arranged in a pattern having no particular order to form a polymer segment. As used herein, the term "random polymer segment" means and includes a modified block copolymer including one or more polymer segments or sequences, each including the monomeric unit and the modifying monomeric unit arranged in a pattern having no particular order (i.e., random). A random polymer segment may be represented herein as $(A_n\text{-r-}A'_p)$, wherein A represents a monomer unit, A' represents a modifying monomer, and each of n, p and r represent the number of repeats.

As used herein, the term "gradient" means and includes a change in an amount or concentration of monomers with a change in polymer chain length. A polymer segment including a monomer gradient may be represented herein as $(A_n\text{-t-}A_m)$, wherein A represent a monomer unit, A' represent a modifying monomer, and each of n and m represent the number of repeats. For example, the first position in the sequence may have about a 100% probability of being an A monomer, the m+n$^{th}$ position has about a 100% probability of being an A' monomer, and the (m+n)/2 position has about a 50% probability of being one of A or A'.

In the representations used herein (e.g., $(A_n\text{-b-}A'_p)_r$, $(A_n\text{-r-}A'_p)$ and $(A_n\text{-t-}A_m)$) capital letters are monomers. Subscript lowercase letters immediately adjacent to a capital letter indicate a number of monomers of a single type in a sequence. Lowercase letters between capital letters and set apart by hyphens indicate an ordering arrangement between the monomers in the sequence. Specifically, "r" indicates random, "b" indicates sequential, "t" indicates tapered (or gradient) and "g" indicates a grafted polymer. Segments or blocks of monomers are set apart by parentheses. Subscript lowercase letters following a closed parentheses mark indicate a number of sequences of the type described by annotation within the parentheses.

As used herein, the term "substrate" means and includes a base material or construction upon which materials are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), or supercritical fluid-assisted annealing. As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The term "preferential wetting," as used herein, means and includes wetting of a contacting surface by a block copolymer wherein one block of the block copolymer will wet a contacting surface at an interface with lower free energy than the other block(s).

As discussed in further detail below, in some embodiments, the present invention includes methods of modifying a $\chi$ value between the polymer blocks of at least one block copolymer that includes a plurality of polymer blocks. For example, the $\chi$ value of the block copolymer may be tailored by producing a modified block copolymer having desirable properties, such as a reduced equilibrium defectivity level and a reduced self assembly time. The modified block copolymer may exhibit desirable physical and chemical properties, such as inherent domain selectivity, developability and preferential wetting to substrate interfaces. The block polymer may include at least one of polystyrene-b-poly(dimethylsiloxane) (PS-b-PDMS) or polystyrene-b-poly(4-vinylpyridine) (PS-b-P4VP). Tailoring the $\chi$ value of the modified block polymer provides control over interactions between polymer blocks of the plurality of polymer blocks and, thus, enables control of the self-assembly processing conditions (e.g., anneal time, anneal temperature, solvent partial pressure, etc.) and the equilibrium defectivity of the self-assembled modified block copolymer. For example, tailoring the $\chi$ value of the modified block polymer may enable thermal annealing of the modified block polymer instead of conventional solvent annealing used with the unmodified block polymer. Furthermore, tailoring the $\chi$ value of the modified block polymer may reduce an amount of solvent used in the solvent annealing of the modified block polymer, which may, in turn, reduce swelling and dimension changes during self-assembly resulting in decreased defectivity of the self-assembled structure. To modify the $\chi$ value of the block copolymer, a modifying monomer or a polymer segment may be incorporated in at least one of the plurality of polymer blocks in an alternating or random fashion. In additional embodiments, another monomer, another polymer segment or a chemical moiety may be grafted onto the block copolymer or the modified block copolymer to modify the $\chi$ value thereof.

The present invention further includes a modified block polymer that includes a modifying monomer in at least one polymer segment thereof and having a $\chi$ value of within a desired range. For example, the modified block polymer may be produced to have a $\chi$ value that enables equilibrated self-assembly to occur in less than or equal to about four (4) hours and that provides a self-assembled modified block copolymer having an equilibrium defectivity of less than about 0.5 defects per square centimeter ($cm^2$) and, more particularly, less than or equal to about 0.03 defects per square centimeter ($cm^2$). As previously discussed, the degree of polymerization (i.e., a number of monomer repeats in a block copolymer chain) (N) also influences the phase behavior (i.e., self-assembly) of the block copolymer. Accordingly, the modified block copolymer be produced to have a product $\chi N$ of between about 40 and about 135 and, more particularly, between about 47.7 and about 132.7, to provide self-assembly within an acceptable time frame (i.e., less than or equal to about four (4) hours) and to provide a self-assembled modified block copolymer having an acceptable range of defectivity (i.e., less than about 0.5 defects per square centimeter ($cm^2$)).

The modified block copolymer may be formed by selecting a modifying monomer that provides a different $\chi$ value than the monomers of at least one of the polymer blocks of the block copolymer. For example, the modified block copolymer may have a substantially reduced $\chi$ value in comparison to the unmodified (i.e., parent) block copolymer. The modifying monomer may be polymerized with at least one of the monomers of a first or second polymer segment to form the modified polymer segment. The modified polymer segment including the modifying monomer may be bonded with at least one of the first and second polymer blocks, or with another polymer block including the modifying monomer, to form the modified diblock polymer having a substantially reduced or substantially increased $\chi$ value range in comparison to the unmodified diblock polymer. At least one of the blocks of the diblock copolymer may include the modifying monomer randomly dispersed within or alternating in succession with the parent monomer. As another example, the modifying monomer may be incorporated into one of the blocks or segments such that the block or segment includes a gradient in a concentration of the modifying monomer over the length of the parent polymer block or segment.

The following description provides specific details, such as material types, material thicknesses, and processing conditions in order to provide a thorough description of embodiments of the invention. However, a person of ordinary skill in the art will understand that the embodiments of the invention may be practiced without employing these specific details. The embodiments of the invention may be practiced in conjunction with conventional semiconductor fabrication techniques employed in the industry.

The materials described herein may be formed by any suitable technique including, but not limited to, spin-coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

Figure 2:
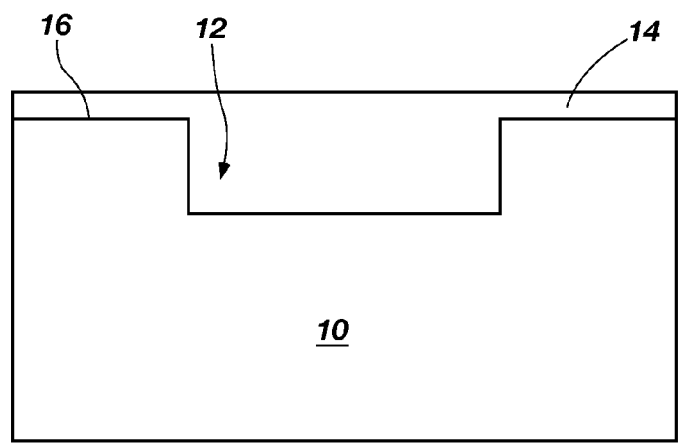
FIGS. 2 and 3 are partial cross-sectional views illustrating an embodiment of a method of forming a self-assembled block copolymer on a substrate.

FIG. 2 is a partial cross-sectional schematic view of an embodiment of a substrate 10 having a boundary, such as trench 12, therein. For the sake of clarity, the boundary is shown as the trench 12 structure. However, other types of topological boundaries, such as weirs, channel, supports, or other structures may also be used. In addition, other types of boundaries may include chemical boundaries on chemically patterned substrates, as discussed below. The substrate 10, as previously discussed, may be a full or partial wafer of semiconductor material or a material such as glass or sapphire. The trench 12 may be filled with a block copolymer material 14. As a non-limiting example, the block copolymer may be a diblock copolymer that includes a less polar block and a more polar block. The more polar block may include a polymer formulated for swelling or wetting upon contact with a solvent, such as an alcohol. The less polar block may include a polymer insoluble in the solvent, such as an alcohol, which results in swelling or wetting the more polar block upon contact.

By way of non-limiting example, the block copolymer may include at least one block of poly(9,9-bis(6'-N,N,Ntrimethylammonium)-hexyl)-fluorene phenylene) (PFP), polydimethylsiloxane (PDMS), poly(4-vinylpyridine) (4PVP), hydroxypropyl methylcellulose (HPMC), polyethylene glycol (PEG), poly(ethylene oxide)-co-poly(propylene oxide) di- or multiblock copolymers, poly(vinyl alcohol) (PVA), poly(ethylene-co-vinyl alcohol), poly(acrylic acid), poly(ethyloxazoline), a poly(alkylacrylate), poly(acrylamide), a poly(N-alkylacrylamide), a poly(N,N-dialkylacrylamide), poly(propylene glycol) (PPG), poly(propylene oxide), partially or fully hydrolyzed poly(vinyl alcohol), dextran, polystyrene (PS), polyethylene (PE), polypropylene (PP), polychloroprene (CR), a polyvinyl ether, poly(vinyl acetate) ($PV_{Ac}$), poly(vinyl chloride) (PVC), a polysiloxane, a polyurethane (PU), a polyacrylate, and a polyacrylamide.

The trench 12 may be defined by a lower surface and sidewalls of the substrate 10. For the sake of clarity, the substrate 10 depicted in the drawings includes one trench 12 formed partially through a thickness thereof. However, in actuality, a plurality of trenches 12 may be formed in the structure 10. The trench 12 may have a depth sufficient to form at least a monolayer of phase separated block copolymer domains, which is described in further detail below. For example, the trench 12 may have a depth in a range of from about 15 nm to about 50 nm, and may be formed using, for example, photolithography techniques (e.g., masking and etching) known in the art of integrated circuit fabrication. Additionally, in some embodiments, another dielectric material (not shown), such as silicon dioxide, may be formed over the sidewalls and the lower surface of the trench 12 using a process such as atomic layer deposition (ALD) before forming the block copolymer material 14 therein. As a non-limiting example, the another dielectric material may be a thin, conformal film of a material that preferentially wets a one domain of the block copolymer material 14, as will be described in further detail herein.

Referring still to FIG. 2, the block copolymer material 14 may be provided over the substrate 10 (i.e., over an exposed surface 16 of the substrate 10 and within the trench 12). By way of example and not limitation, the block copolymer material 14 may be deposited over the structure 10 to a thickness sufficient to fill the trench 12 and to overlie surfaces 16 of the substrate 10. As a non-limiting example, the block copolymer material 14 overlying the surfaces 16 of the substrate 10 may have a thickness of less than or equal to a monolayer of phase separated block copolymer domains. The block copolymer material 14 may be applied by any suitable technique such as, for example, spin-casting, spin-coating, spraying, ink coating, or dip coating.

The block copolymer material 14 may include at least two polymer blocks (i.e., a first polymer block and a second polymer block) that are substantially immiscible in one another. By way of non-limiting example, the block copolymer material 14 is a diblock copolymer that includes a more polar block and a less polar block, with sufficient $\chi$ value between the two blocks to spontaneously undergo phase separation during annealing. In some embodiments, the block copolymer material 14 may include the more polar block and the less polar block at a ratio in a range of from about 20:80 by weight to about 50:50 by weight and, more specifically, at a ratio of about 30:70 by weight. In other embodiments, the block copolymer material 14 may include the more polar block and the less polar block at a ratio in a range of from about 80:20 by weight to about 50:50 by weight and, more specifically, at a ratio of about 70:30 by weight.

By way of non-limiting example, block copolymer materials 14 that may be used for forming the self-assembled block copolymer may include polystyrene-block-polydimethylsiloxane (PS-b-PDMS), polystyrene-block-poly(4-vinylpyridine) (PS-b-4PVP), polystyrene-block-poly(9,9-bis(6'-N,N,Ntrimethylammonium)-hexyl)-fluorene phenylene) (PS-b-PFP), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

As previously described, the block copolymer may be a diblock copolymer. However, block copolymers having three (a triblock copolymer) or more (a multiblock copolymer) blocks may also be used. One example of a triblock copolymer includes, but is not limited to, poly(styrene-block methyl methacrylate-block-ethylene oxide). Multiblock copolymers may have three or more blocks selected from the following: polystyrene, polydimethylsiloxane poly(4-vinylpyridine), polymethylmethacrylate, polyethyleneoxide, polyisoprene, polybutadiene, poly lactic acid, polyvinylpyridine, and combinations thereof.

Figure 3:
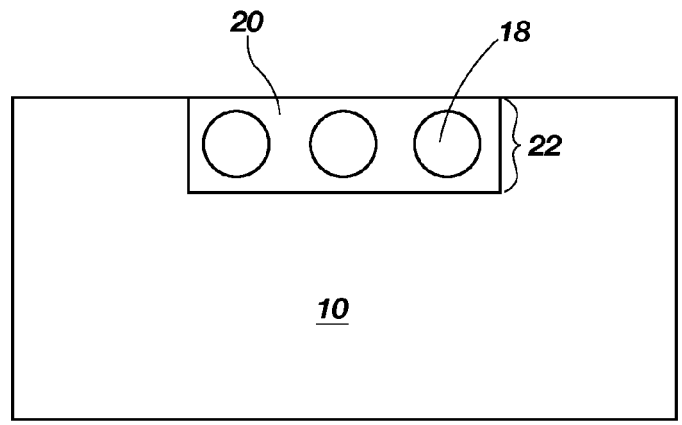

Referring to FIG. 3, an annealing process may be used to initiate microphase separation between the polymer blocks of the block copolymer material 14. The block copolymer material 14 may be annealed using, for example, thermal annealing, solvent vapor-assisted annealing, supercritical fluid-assisted annealing, or a combination thereof, which is described in further detail below. During annealing, the block copolymer material 14 may undergo microphase separation wherein the sidewalls of the trench 12 guide self-assembly, or self-registration, of the polymer blocks of the block copolymer material 14, which is often referred to as "graphoepitaxy," so as to form a plurality of ordered domains 18 including at least one polymer block within a matrix 20 of at least one different polymer block. For simplicity, the matrix 20 is shown as surrounding the ordered domains 18 in FIG. 3. In other embodiments, the matrix 20 may anneal into another domain depending on a volume fraction ratio of the first polymer block to the second polymer block. The ordered domains 18 may include repeating structural units having a regular or defined order. Specifically, the lower surface and the sidewalls of the trench 12 may be most preferentially wetted by at least the minority block of the at least two polymer blocks of the block copolymer material 14. The preferential wetting of the minority polymer block with both the lower surface and sidewalls of the trench 12 results in the formation of the ordered domains 18 within the trench 12.

In the embodiment illustrated in FIG. 3, self-assembly of the block copolymer material is directed topographically by the trench 12 in the substrate 10. In other embodiments, which are not shown for the sake of simplifying the presently disclosed invention, self-assembly of the block copolymer material 14 (FIG. 2) may be directed chemically using a substrate including a chemically patterned surface having chemical specificity to at least one polymer block of the block copolymer material 14 that may be used to provide preferential or neutral wetting regions that direct the self-assembly process. In yet further embodiments, a combination of chemically and topographically patterned substrates may be used to direct the self-assembly of the block copolymer material 14.

Each of the domains 18 includes self-aggregated minority block portions of polymer blocks held together by non-covalent bonds and aligned parallel to an axis of the trench 12 (FIG. 2). By way of non-limiting example, phase separation of the block copolymer material 14 may result in the formation of a self-assembled structure 22 including an ordered array of ordered domains 18 surrounded by the matrix 20. For example, where the block copolymer material 14 includes the more polar block and the less polar block, the domains 18 may include the more polar block, and the matrix 20 may include the less polar block. The number of domains 18 may be determined by the width of the trench 12 together with the inherent periodicity ($L_o$) of the block copolymer material 14. The width of the trench 12 may be controlled to form a number of ordered domains 18 in a range of from about one (1) to about one million ($10^6$) and, more particularly, from about one (1) to about one hundred twenty eight (128).

In some embodiments, the block copolymer material 14 may be heated to a temperature at or above a glass transition temperature and below a decomposition temperature of the polymer blocks either in a vacuum or in an inert atmosphere, to cause the block copolymer material 14 to microphase separate and form the self-assembled structure 22. The inert atmosphere may include, by way of non-limiting example, nitrogen or argon. For example, the block copolymer material 14 may be heated to a temperature in a range of from about 130° C. to about 275° C.

In additional embodiments, the block copolymer material 14 may be exposed to solvent vapors of a solvent in which both blocks are soluble to cause microphase separation and the formation of ordered domains 18. By way of non-limiting example, the solvent vapor may be formed from toluene, heptanes, tetrahydrofuran, dimethylformamide, or combinations thereof. For example, the block copolymer material 14 may be annealed by exposing the block copolymer material 14 to toluene vapor.

For block copolymer self-assembly to be successfully used in sub-lithographic patterning methods as shown in FIGS. 2 and 3, desired properties of the block copolymer material 14 include: (1) self-assembly within a manufacturable period of time; (2) a manufacturable level of defects in the self-assembled structure; (3) alignment of the self-assembled structure to underlying layers; and (4) selective development of one domain over another domain (e.g., a matrix surrounding a domain of the self-assembled structure). Using a block copolymer material 14 enables processing similar to a conventional photoresist, including acts of coating, annealing (in place of photo exposure), and developing. Currently available block copolymers do not exhibit all of the desired properties and, thus, may not be suitable for current manufacturable processing.

The integration of block copolymer lithography into IC manufacturing has been restricted because the available block copolymers cannot be self-assembled within process constraints, to provide the physiochemical properties required of an etch mask. As discussed above, self-assembled block copolymer lithography patterns must meet pattern fidelity (line edge roughness) & defect density requirements, while providing the material properties necessary for selective development of one domain from the other(s) and for masking during pattern transfer (etch) into the underlying substrate. In order to meet both sets of requirements, modified block copolymer materials need to be formulated to meet multiple performance criteria. Since both the pattern fidelity and defect density are largely influenced by the miscibility of the block copolymer blocks in one another, which is characterized by their $\chi$ value, the ability to tailor the effective $\chi$ value of a block copolymer enables such manufacturing constraints to be balanced with the desired material properties. Accordingly, it is desirable to provide methods that enable a continuum of $\chi$ values to be achieved from block copolymers exhibiting desired material properties.

The $\chi$ value of a block copolymer may be tailored by modification of a portion of at least one of the blocks of the copolymer. As the $\chi$ value of a block polymer decreases, an anneal time for the block polymer to reach a self-assembled state (i.e., a thermodynamic equilibrium state) also decreases. However, the equilibrium defectivity of the assembled block copolymer pattern increases as the $\chi$ value decreases. Thus, as the $\chi$ value of a block polymer decreases, the number of defects in the block polymer as the block polymer undergoes microphase segregation into the self-assembled state may reach an unacceptable level for use in lithographic processes. As a non-limiting example, the manufacturable defectivity may be less than or equal to about 0.03 defects per square centimeter ($cm^2$). The anneal time to thermodynamic equilibrium may be from about one (1) minute to about two-hundred and forty (240) minutes.

The $\chi$ value of the block copolymer may be tailored by incorporating a modifying monomer or a polymer segment into at least one of the plurality of polymer blocks thereof. For example, a modified block polymer may be formed by polymerizing a monomer (A or B) of a block copolymer ((A)n-b-(B)m) with a modifying monomer (A' or B') to tailor the $\chi$ value of the modified block copolymer without substantially changing desirable material properties of the unmodified block copolymer. The modifying monomer may be polymerized with the monomer of a parent polymer block to form a polymer segment or block that includes the modifying monomer distributed randomly with the parent monomer of the block (i.e., a random polymer segment), or alternating in succession with the parent monomer of the block (i.e., an alternating polymer segment). As another non-limiting example, the modifying monomer may be polymerized with the parent monomers of the polymer block so that the polymer segment or block includes a gradient of the modifying monomer (i.e., the concentration of the modifying monomer may increase or decrease along a length of the polymer segment).

The $\chi$ value of the diblock copolymer that includes two polymer blocks (i.e., a first polymer block and a second polymer block) may be modified by including a modifying monomer in at least one of the polymer blocks. By incorporating the modifying monomer in at least one of the polymer blocks of the diblock copolymer, the $\chi$ value between the first and second polymer blocks of a modified block polymer may be substantially increased or decreased without substantially changing material properties (e.g., etch selectivity and self-assembly) of the diblock copolymer. Thus, the modifying monomer may be selected based on a change in the $\chi$ value between the polymer blocks resulting from incorporation of the modifying monomer in at least one of the polymer blocks of the diblock copolymer. An amount of the modifying monomer that may be polymerized with the parent monomers at least one of the polymer blocks may be determined based on an effect of the modifying monomer on the $\chi$ value and the resulting properties (i.e., anneal time and equilibrium defectivity) relative to the unmodified block copolymer.

For example, the random polymer segment may include a parent monomer and the modifying monomer or graft. A ratio of a number, mass or volume fraction of the parent monomer to the modifying monomer or graft may be selected based on a minimum quantity of the modifying monomer or graft that may be incorporated into the polymer segment to provide a desired effective $\chi$ value of the resulting block copolymer that includes the modified random polymer segment. As a non-limiting example, the random polymer segment may include from about one percent (1%) to about fifty percent (50%) of the modifying monomer or graft and, more particularly, from about three percent (3%) to about fifteen percent (15%) of the modifying monomer or graft. Tailoring the block copolymer to include an amount of the modifying monomer or graft less than or equal to an amount of the parent monomer enables the $\chi$ value to be tailored without adversely affecting the material properties of the modified block polymer.

The concentration of the modifying monomer or graft may increase or decrease along the length of the polymer segment to form a gradient of the modifying monomer or graft. As a non-limiting example, to form the polymer segment including a gradient of the modifying monomer or graft, a desired feed ratio of the modifying monomer or graft to the parent monomer is varied during polymerization of the polymer segment to achieve the desired gradient of the modifying monomer or graft in the polymer segment.

A graft polymer may be formed by covalently linking at least one polymer segment to a main polymer block or main polymer chain. In some embodiments, the at least one polymer segment may be linked to the main polymer block after polymerization thereof. In other embodiments, at least one polymer segment may be linked to at least one monomer of the main polymer block before polymerization of a main polymer block to form a modified macromonomer. The polymer segments linked along the main polymer block may change the $\chi$ value of the main polymer block without substantially affecting the material properties of the main polymer block. To form the graft polymer, reactive groups may be introduced along the main polymer block and may initiate a polymerization reaction of monomers of the polymer segment to the main polymer block to covalently link the polymer segment to the main polymer block. The main polymer block may include a plurality of reactive groups and at least one polymer segment including a reactive group at a single end thereof which may link a graft polymer to the main polymer block.

In some embodiments, the block copolymer may be modified to tailor the $\chi$ value during polymerization of the monomeric units. For example, the block copolymer may include at least two polymer blocks that may be selectively etched with respect to one another and that may undergo microphase segregation to form distinct ordered domains 18 in the matrix 20 as shown in FIG. 3. For example, the block copolymer may be a diblock copolymer that includes a first polymer block and a second polymer block, such as PS-b-PDMS, PS-b-4PVP or PS-b-PFP. The interaction between the first polymer block and the second polymer block of the block copolymer may be controlled by modifying at least one of the first polymer block and the second polymer block. For example, at least one of the first polymer block and the second polymer block may be modified by including a modifying monomer therein, or by forming a graft polymer segment that includes at least one macromonomer.

As a non-limiting example, the $\chi$ value of the diblock copolymer may be substantially reduced by incorporating the modifying monomer into at least one of the first polymer block and the second polymer block of the diblock copolymer. The selection of modifying monomers may depend on at least one of the parent monomer, the monomer in the second polymer block, and a method of self-assembly of the block copolymer. The modifying monomer may be selected based on compatibility with the self-assembly method of the block copolymer. Such a modifying monomer may behave substantially similar to the parent monomer, but may have increase solubility in the second polymer block. As a non-limiting example, the modifying monomer for modification of a polystyrene block may include at least one of a hydroxystyrene, such as 4-hydroxystyrene, 3-hydroxystyrene, 2-hydroxystyrene, 2-methyl-4-hydroxystyrene, 2-tert-butyl-4-hydroxystyrene, 3-methyl-4-hydroxystyrene, 2-fluoro-4-hydroxystyrene, 2-chloro-4-hydroxystyrene, 3,4-dihydroxystyrene, 3,5-dihydoxystyrene, 3,4.5-trihydroxystyrene, 3,5-dimethyl-4-hydroxystyrene, 3,5-tert-butyl-4-hydroxystyrene; a siloxystyrene, such as 4-trimethylsiloxystyrene, and 3,5-dimethyl-4-trimethylsiloxystyrene; and a 4-acetoxystyrene, such as 5-di(methyl, bromo or chloro)-4-acetoxystyrene. The modifying monomer for modification of a polymer block that includes alcohol may include, for example, at least one silyl ether, such as trimethylsilyl ether, t-butyldimethylsilyl ether, and tert-butyldiphenylsilyl. For example, the modifying monomer for modification of a polydimethylsiloxane block may include a siloxane, such as phenyl(methyl)siloxane, dimethylsiloxane, and trifluoropropyl methyl siloxane. For example, the modifying monomer for modification of a poly (4-vinylpyridine) block may include a vinylpyridine, such as 2-vinylpyridine and 4-vinylpyridine.

PS-b-PDMS exhibits a $\chi$ value of about 0.26 at room temperature and, thus, exhibits strong microphase segregation at annealing temperatures at or near a decomposition temperature of the PS-b-PDMS. The high $\chi$ value of PS-b-PDMS further suggests that PS-b-PDMS may achieve ordered domains and lower defectivity than block copolymers having lower $\chi$ values, such as a polystyrene-polymethylacrylate block copolymer (PS-b-PMMA), which has a $\chi$ value of about 0.08 at room temperature. Once the PS-b-PDMS has self-assembled into domains of the polystyrene and the polydimethylsiloxane, the silicon-rich polydimethylsiloxane domains are inherently resistant to dry etch develop conditions that remove the polystyrene domains. Therefore, self-assembled structures suitable for pattern transfer into an underlying substrate may be formed from the PS-b-PDMS without additional processing acts, such as metal staining or exposure to ultraviolet radiation, that are otherwise used to confer etch selectivity between blocks of other block copolymer materials, such as PS-b-PMMA. Such additional processing acts may introduce defects and reduce pattern fidelity in the domains of a self-assembled block copolymer structure and, in addition, may increase fabrication costs. A particularly pertinent comparison is the formation of self-assembled structures from a polystyrene-2-vinyl pyridine block copolymer (PS-b-P2VP) versus PS-b-PDMS. The PS-b-P2VP is selectively functionalized with a metal in the P2VP domain to confer etch selectivity. This creates problematic line edge roughness relative to domains of the self-assembled PS-b-PDMS structure. Since PS-b-PDMS includes domains that are inherently etch selective, PS-b-PDMS provides improved material properties over other types of block copolymers. However, due to its high $\chi$ value, the PS-b-PDMS may be difficult to anneal into the self-assembled structures within an acceptable amount of time for lithographic processing. Specifically, self-assembly PS-b-PDMS may take in excess of fifteen (15) hours of annealing at a temperature at or near the decomposition temperature of the PS-b-PDMS. Although solvent vapor annealing of the PS-b-PDMS may provide self-assembly in a decreased amount of time, the process may be difficult to perform and may lead to rupturing within the microdomains.

Figure 4:
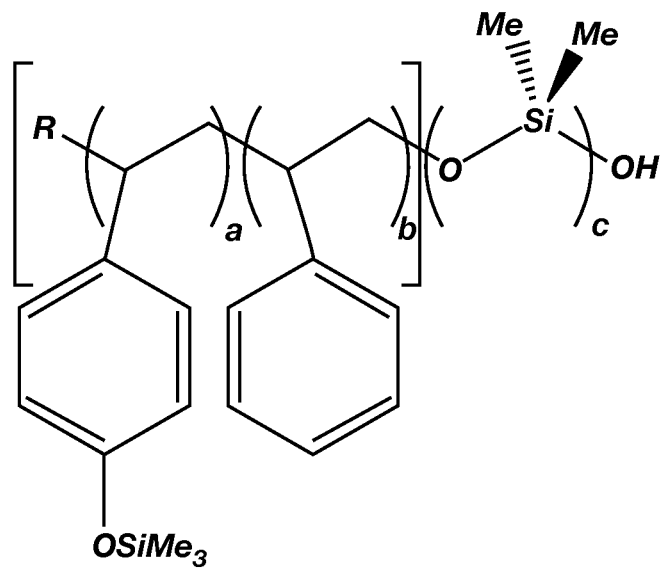
FIGS. 4 through 7 are chemical structures of modified block copolymers formed from the block copolymer shown in FIG. 1 using embodiments of methods of the present invention.

In some embodiments, the $\chi$ value of PS-b-PDMS may be modified by polymerizing at least one of the polystyrene block and the polydimethylsiloxane block with the modifying monomer. For example, the modifying monomer may include at least one of 4-hydroxystyrene and 4-trimethylsiloxystyrene and may be polymerized with the styrene to form a modified polystyrene block. The modified polystyrene block may be formed to include the modifying monomer distributed randomly within the styrene (i.e., a random modified polystyrene block) or alternating in succession with the styrene (i.e., an alternating modified polystyrene block). The random modified polystyrene block may be formed by polymerizing the at least one of 4-hydroxystyrene and 4-trimethylsiloxystyrene with styrene at a ratio of less than 1:1. For example, the random modified polystyrene block may include from about one percent (1%) to about thirty percent (30%), and more particularly from about three percent (3%) to about fifteen percent (15%) of at least one of 4-hydroxystyrene and 4-trimethylsiloxystyrene. FIG. 4 is a chemical structure of a modified PS-b-PDMS-based block copolymer that includes the polydimethylsiloxane block and a random modified polystyrene block (shown in brackets) that comprises 4-trimethylsiloxystyrene polymerized with styrene, wherein c represents a number of repeats of the dimethylsiloxane in the polydimethylsiloxane block, wherein a represents a number of repeats of the 4-trimethylsiloxystyrene in the modified polystyrene block and wherein b represents the number of repeats of the styrene in the modified polystyrene block.

As a non-limiting example, after incorporation of the 4-hydroxystyrene as the modifying monomer in the modified PS-b-PDMS-based block copolymer, the 4-hydroxystyrene may be reacted with trimethylsilyl chloride to form the trimethylsilyl ether or 4-trimethylsiloxystyrene.

The modified polystyrene block may be covalently linked with at least one of the polydimethylsiloxane polymer segment or a modified polydimethylsiloxane block, which will be described in further detail, to form a modified PS-b-PDMS-based block copolymer that exhibits a substantially reduced $\chi$ value in comparison to the $\chi$ value of the unmodified PS-b-PDMS. The modified polystyrene block may also be covalently linked with a polystyrene block that does not include the modifying monomer. The modified block copolymer may exhibit substantially the same material properties (e.g., etch selectivity) as the unmodified PS-b-PDMS.

Figure 5:
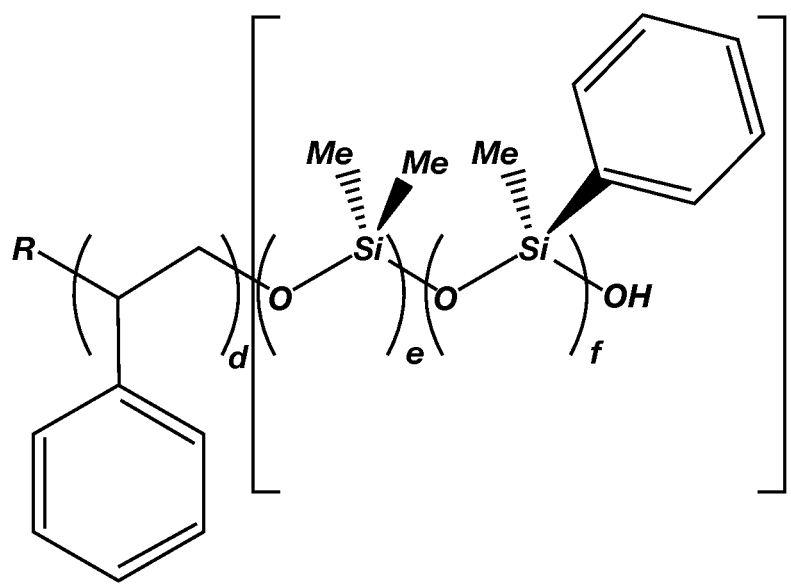

In other embodiments, the modifying monomer may include phenyl(methyl)siloxane and may be polymerized with the polydimethylsiloxane to form the modified polydimethylsiloxane block. The modified polydimethylsiloxane block may be formed to include the modifying monomer distributed randomly within the polydimethylsiloxane (i.e., a random modified polydimethylsiloxane block) or alternating in succession with the polydimethylsiloxane (i.e., an alternating modified polydimethylsiloxane block). The random modified polydimethylsiloxane block may be formed by polymerizing the phenyl(methyl)siloxane with polydimethylsiloxane at a ratio of less than 1:1. For example, the random modified polystyrene block may include from about one percent (1%) to about thirty percent (30%), and more particularly from about three percent (3%) to about fifteen percent (15%) of phenyl(methyl)siloxane. FIG. 5 is a chemical structure of a modified PS-b-PDMS-based block copolymer that includes the polystyrene block and random modified polydimethylsiloxane block (shown in brackets) that comprises phenyl(methyl)siloxane polymerized with polydimethylsiloxane, wherein d represents a number of repeats of the styrene in the polystyrene block, wherein e represents the number of repeats of a dimethylsiloxane in the modified polydimethylsiloxane block, and wherein f represents a number of repeats of the phenyl(methyl)siloxane in the modified polydimethylsiloxane block.

The modified polydimethylsiloxane block may be covalently linked with at least one of the polystyrene block and the modified polystyrene block, which was previously described, to form the modified PS-b-PDMS-based block copolymer that exhibits a substantially reduced $\chi$ value in comparison to the $\chi$ value of the unmodified PS-b-PDMS. The modified polydimethylsiloxane block may also be covalently linked with a polydimethylsiloxane block that does not include the modifying monomer. The modified PS-b-PDMS-based block copolymer may exhibit substantially the same material properties (e.g., etch selectivity) as the unmodified PS-b-PDMS that includes the two polymer blocks (i.e., a polystyrene block and a polydimethylsiloxane block).

The modified PS-b-PDMS-based block copolymer may be further modified to tailor the $\chi$ value thereof by modifying, chemically or physically, at least one of the modified polystyrene block and the modified polydimethylsiloxane block. For example, a graft polymer may be formed by covalently linking at least one polymer segment to the modified PS-b-PDMS-based block copolymer. In some embodiments, the at least one polymer segment may be linked to the modified PS-b-PDMS-based block copolymer after polymerization of the polymer blocks thereof. In other embodiments, the at least one polymer segment may be linked to at least one monomer of the modified PS-b-PDMS-based block copolymer before polymerization of the polymer blocks thereof. The polymer segments linked along the modified PS-b-PDMS-based block copolymer may change a $\chi$ value of the modified PS-b-PDMS-based block copolymer without substantially affecting the material properties of thereof.

Figure 6:
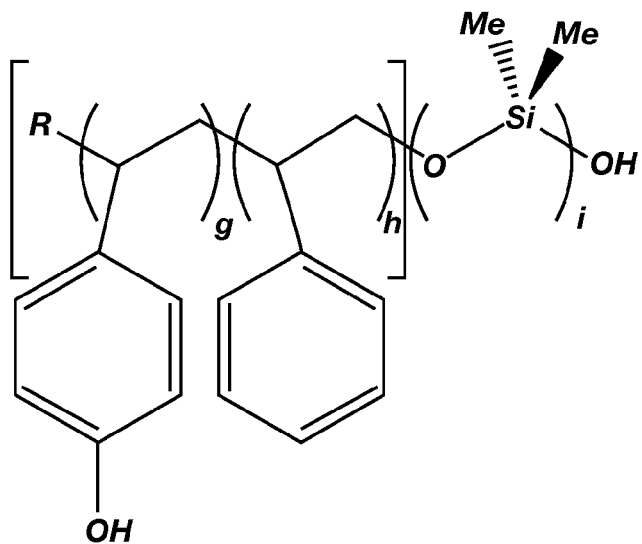

Referring to FIG. 6, the modified PS-b-PDMS-based block copolymer may include the polydimethylsiloxane block and a modified polystyrene block (shown in brackets) that includes styrene as a parent monomer and a lesser amount of 4-hydroxystyrene as the modifying monomer. FIG. 6 is an illustration of a chemical structure of the modified PS-b-PDMS-based block copolymer, wherein g represents a number of repeats of the 4-hydroxystyrene in the modified polystyrene block, h represents a number of repeats of the styrene in the modified polystyrene block, and i represents a number of repeats of the dimethylsiloxane in the polydimethylsiloxane block. For example, the 4-hydroxystyrene modifying monomer includes a hydroxyl group (—OH) that may act as a reactive group for bonding or grafting the polymer segment to the modified PS-b-PDMS-based block copolymer. The 4-hydroxystyrene may be, for example, randomly distributed throughout the styrene of the modified PS-b-PDMS-based block copolymer.

Figure 7:
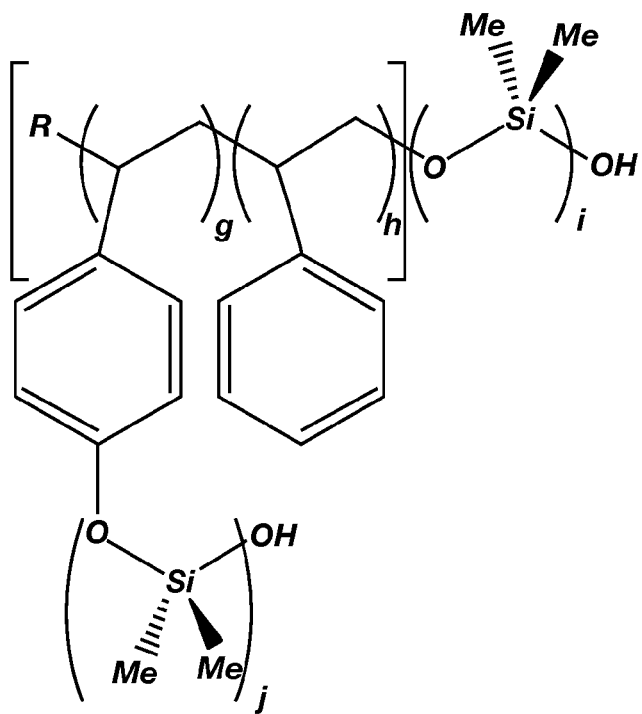

Referring to FIG. 7, a chemical structure of a PS-b-PDMS-based graft polymer formed by grafting a polydimethylsiloxane segment to at least one of the hydroxyl groups of the 4-hydroxystyrene of the modified PS-b-PDMS-based block copolymer shown in FIG. 6, wherein j represents a number of the dimethylsiloxane units in the polydimethylsiloxane block. For example, g, h, i, and j may each be a number less than or equal to about 1800. By way of non-limiting example, (i)/(g+h+j+i) may be less than or equal to about fifteen percent (15%) for a modified block copolymer including spheres comprising i and a matrix comprising g, h, and j, between about fifteen percent (15%) and about thirty-five percent (35%) for a modified block copolymer including cylinders comprising i and a matrix comprising g, h, and j, between about thirty-five percent (35%) and about sixty-five percent (65%) for a modified block copolymer including lamellae comprising one domain including g, h, and j and another domain including i. The modified PS-b-PDMS-based block copolymer may include a modified polystyrene block that includes styrene as a parent monomer and a lesser amount of 4-hydroxystyrene as the modifying monomer. The 4-hydroxystyrene may be, for example, randomly distributed throughout the styrene of the modified PS-b-PDMS-based block copolymer. For example, the polydimethylsiloxane segment may be grafted to the hydroxyl group of the 4-hydroxystyrene via an ether bond. The ether bond may be formed between the polydimethylsiloxane segment and the hydroxyl group using conventional methods, the details of which are known in the art and are not described herein. In some embodiments, a polydimethylsiloxane segment may be linked to at least one monomer of the modified PS-b-PDMS-based block copolymer after polymerization of the polymer blocks thereof. In other embodiments, at least one polydimethylsiloxane segment may be linked to at least one monomer of the modified PS-b-PDMS-based block copolymer before polymerization of the polymer blocks thereof.

In yet further embodiments, the $\chi$ value of PS-b-PDMS may be modified by grafting at least one of a moiety to at least one of the monomers of the polydimethylsiloxane block to form a PS-b-PDMS-based graft copolymer. The vinyl(dimethyl)siloxy ether of a hydroxy-terminated polystyrene oligomer may be grafted to at least one of the monomers of the polydimethylsiloxane block using a conventional peroxide-cure grafting process. Grafting the at least one polymer segment may increase the compatibility of the polystyrene block and the polydimethylsiloxane block in one another. For example, the moiety may include at least one of a silyl group (e.g., —$SiO_3$ and —$SiR_3$), an alkyl, an aryl and a polar group (e.g., a hydroxyl-containing group), and a polymer segment, such as a vinyl(dimethyl)siloxy ether of a hydroxyl-terminated polystyrene polymer.

PS-b-P4VP includes a polystyrene block and poly-4-vinylpyridine block. PS-b-P4VP is a non-ionic amphiphilic system and exhibits strong microphase segregation into the self-assembled structure. The poly(4-vinylpyridine) block is highly polar resulting in a high degree of dipolar polarization of the poly(4-vinylpyridine) block and a strong repulsive interaction between the polystyrene and the poly(4-vinylpyridine) blocks. The $\chi$ value of PS-b-P4VP is about 0.54 at room temperature. Additionally, once the PS-b-P4VP has self-assembled into ordered domains of polystyrene and poly(4-vinylpyridine), the poly(4-vinylpyridine) domain may be stained with metals and then etched selective to the polystyrene domain.

The $\chi$ value of PS-b-P4VP may be modified by polymerizing at least one of the polystyrene block and the poly(4-vinylpyridine) block with the modifying monomer. For example, the modifying monomer may include 4-hydroxystyrene and may be polymerized with the styrene to form a modified polystyrene block. The modified polystyrene block may be formed to include the modifying monomer distributed randomly within the styrene (i.e., a random modified polystyrene block) or alternating in succession with the styrene (i.e., an alternating modified polystyrene block). The random modified polystyrene block may be formed by polymerizing the 4-hydroxystyrene with styrene at a ratio of less than 1:1. For example, the random modified polystyrene block may include from about one percent (1%) to about thirty percent (30%), and more particularly from about one percent (1%) to about fifteen percent (15%) of at least one of 4-hydroxystyrene. The modified polystyrene block may be covalently linked with at least one of the poly(4-vinylpyridine) block or a modified poly(4-vinylpyridine) block, which will be described, to form a modified block copolymer exhibiting a substantially decreased $\chi$ value in comparison to the $\chi$ value of the PS-b-P4VP. The modified polystyrene block may also be covalently linked with a polystyrene block that does not include the modifying monomer. The modified polystyrene block copolymer may exhibit substantially the same material properties as the PS-b-P4VP.

For example, the modifying monomer may comprise 2-vinylpyridine and may be polymerized with the poly(4-vinylpyridine) to form the modified poly(4-vinylpyridine) block. The modified poly(4-vinylpyridine) block may be formed to include the 2-vinylpyridine distributed randomly within the poly(4-vinylpyridine) (i.e., a random modified poly(4-vinylpyridine) block) or alternating in succession with the poly(4-vinylpyridine) (i.e., an alternating modified poly(4-vinylpyridine) polymer segment). The random modified poly(4-vinylpyridine) block may be formed by polymerizing 2-vinylpyridine with poly(4-vinylpyridine) at a ratio of less than 1:1. For example, the random modified poly(4-vinylpyridine) block may include from about one percent (1%) to about thirty percent (30%), and more particularly, from about three percent (3%) to about fifteen percent (15%) of the 2-vinylpyridine. The modified poly(4-vinylpyridine) block may be covalently linked with at least one of the polystyrene block and the modified polystyrene block, which was previously described, to foam the modified PS-b-P4VP-based block copolymer exhibiting a substantially decreased $\chi$ value in comparison to the $\chi$ value of the unmodified PS-b-P4VP. The modified poly(4-vinylpyridine) block may also be covalently linked with a poly(4-vinylpyridine) block that does not include the modifying monomer. The modified PS-b-P4VP-based block copolymer may exhibit substantially the same material properties as the unmodified PS-b-P4VP.

The modified PS-b-P4VP-based block copolymer may be further modified to tailor the $\chi$ value thereof by modifying, chemically or physically, at least one of the modified polystyrene block and the modified poly(4-vinylpyridine) block. For example, a graft polymer may be formed by covalently linking at least one polymer segment to the modified PS-b-P4VP-based block copolymer. The polymer segments linked along the modified PS-b-P4VP-based block copolymer may change a $\chi$ value of the modified PS-b-P4VP-based block copolymer without substantially affecting the material properties thereof.

For example, the modified PS-b-P4VP-based block copolymer may include a modified polystyrene block that includes styrene as a parent monomer and a lesser amount of 4-bromomethylstyrene as the modifying monomer. The 4-bromomethylstyrene may be, for example, randomly distributed throughout the polystyrene block of the modified PS-b-P4VP-based block copolymer (i.e., P(S-4BrMeS)-b-P4VP). At least one hydroxyl-terminated poly(4-vinylpyridine) segment may be grafted to a poly(4-(bromomethyl)styrene) segment to form a modified P(S-4BrMeS)-b-P4VP-based block copolymer. The hydroxyl-terminated poly(4-vinylpyridine) may be grafted to the (4-(bromomethyl)) monomer units using conventional methods, the details of which are known in the art and are not discussed herein.

As another non-limiting example, the modified PS-b-P4VP-based block copolymer may include a modified poly(4-vinylpyridine) block that includes 4-vinylpyridine as a parent monomer and a lesser amount of (azidomethyl)styrene as the modifying monomer. The (azidomethyl)styrene may be, for example, randomly distributed throughout the poly(4-vinylpyridine) block of the modified PS-b-P4VP-based block copolymer. A PS-b-P4VP-based graft polymer may be formed by grafting an oligopolystyrene propynoate segment to at least one of the (azidomethyl)styrene monomers using a conventional Huisgen reaction, the details of which are known in the art and are not discussed herein. The PS-b-P4VP-based graft polymer may include at least one of the poly(4-(bromomethyl)styrene) block grafted to the hydroxyl-terminated 4-vinylpyridine within the modified polystyrene block and the poly(azidomethyl)styrene block grafted to at least one of the oligopolystyrene propynoate segment within the modified poly(4-vinylpyridine) block.

In another embodiment, the block copolymer may be modified to tailor the $\chi$ value thereof by functionalizing at least one end group of the block copolymer. The end groups of the block copolymers may be functionalized using conventional methods that are known in the art and are not described herein. For example, the end groups of the block copolymer may be functionalized by grafting at least one of a polymer segment or a chemical moiety thereto.

The following examples serve to explain embodiments of the present invention in more detail. These examples are not to be construed as being exhaustive or exclusive as to the scope of this invention.

Example 1

Random and Alternating Modified Block Copolymers

Table 1 provides examples of embodiments of modified PS-b-PDMS-based block copolymers and modified PS-b-P4VP-based block copolymers that may be formed according to the methods disclosed herein. The modified PS-b-PDMS-based block copolymers and modified PS-b-P4VP-based block copolymers may include random polymer segments and/or alternating polymer segments. In each of the modified block copolymers shown in Table 1, n, m, p and q each represent a number of repeats of the designated polymer segment. A total molecular weight of the modified block polymers may be less than or equal to about one hundred eighty kilograms/mole (180 kg/mol).

TABLE 1

| Block Copolymer | Modified PS-b-PDMS-Based Block Copolymers | Modified PS-b-P4VP-Based Block Copolymers |
|---|---|---|
| $(A_n\text{-r-}A'_m)\text{-b-}B_p$ | A = styrene<br>A' = 4-hydroxystyrene and/or trimethylsilyl ether<br>B = dimethylsiloxane | A = styrene<br>A' = 4-hydroxystyrene<br>B = 4-vinylpyridine |
| $A_n\text{-b-}(B_m\text{-r-}B'_p)$ | A = styrene<br>B = dimethylsiloxane<br>B' = phenyl(methyl)siloxane | A = styrene<br>B = 4-vinylpyridine<br>B' = 2-vinylpyridine |
| $(A_n\text{-r-}A'_m)\text{-b-}(B_o\text{-r-}B'_p)$ | A = styrene<br>A' = 4-hydroxystyrene and/or trimethylsilyl ether<br>B = dimethylsiloxane<br>B' = phenyl(methyl)siloxane | A = styrene<br>A' = 4-hydroxystyrene<br>B = 4-vinylpyridine<br>B' = 2-vinylpyridine |
| $(A_n'\text{-a-}A_m)\text{-b-}B_p$ | A = styrene<br>A' = 4-hydroxystyrene and/or trimethylsilyl ether<br>B = dimethylsiloxane | A = styrene<br>A' = 4-hydroxystyrene<br>B = 4-vinylpyridine |
| $A_n\text{-b-}(B_n\text{-a-}B'_p)$ | A = styrene<br>B' = phenyl(methyl)siloxane<br>B = dimethylsiloxane | A = styrene<br>B = 4-vinylpyridine<br>B' = 2-vinylpyridine |
| $(A_n\text{-a-}A'_m)\text{-b-}(B\text{-a-}B')_m$ | A = styrene<br>A' = 4-hydroxystyrene and/or trimethylsilyl ether<br>B = dimethylsiloxane<br>B' = phenyl(methyl)siloxane | A = styrene<br>A' = 4-hydroxystyrene<br>B = 4-vinylpyridine<br>B' = 2-vinylpyridine |
| $[((A_n\text{-a-}A'_m)\text{-b-}(A)_o]\text{-b-}(B)_m$ | A = styrene<br>A' = 4-hydroxystyrene and/or trimethylsilyl ether<br>B = dimethylsiloxane | A = styrene<br>A' = 4-hydroxystyrene<br>B = 4-vinylpyridine |
| $A_n\text{-b-}(B_m\text{-a-}B'_o)\text{-b-}(B)_p]$ | A = styrene<br>B = dimethylsiloxane<br>B' = phenyl(methyl)siloxane | A = styrene<br>B = 4-vinylpyridine<br>B' = 2-vinylpyridine |
| $[(A_n\text{-a-}A'_m)\text{-b-}(A)_o]\text{-b-}[(B_p\text{-a-}B'_q)\text{-b-}(B)_r]$ | A = styrene<br>A' = 4-hydroxystyrene and/or trimethylsilyl ether<br>B = dimethylsiloxane<br>B' = phenyl(methyl)siloxane | A = styrene<br>A' = 4-hydroxystyrene<br>B = 4-vinylpyridine<br>B' = 2-vinylpyridine |

Example 2

Modified Graft Copolymers

Table 2 provides examples of embodiments of PS-b-PDMS-based graft copolymers and PS-b-P4VP-based graft copolymers that may be formed according to the methods disclosed herein. The modified PS-b-PDMS-based block copolymers and modified PS-b-P4VP-based block copolymers may include random polymer segments and/or alternating polymer segments. In each of the modified graft copolymers shown in Table 2, n and m each represent a number of repeats of the designated polymer segment. A total molecular weight of the modified block polymers may be less than or equal to about one hundred eighty kilograms/mole (180 kg/mol).

mer to decrease the $\chi$ value of the block copolymer. Additionally, the at least one of the plurality of polymer blocks of the block copolymer may be modified by grafting at least one modifying polymer segment onto the at least one of the plurality of polymer blocks to change the $\chi$ value of the block copolymer. At least one of a polystyrene-b-polydimethylsiloxane block copolymer and a polystyrene-b-poly(4-vinylpyridine) block copolymer may be modified to reduce the $\chi$ value thereof.

In additional embodiments, the methods for modifying a block copolymer may include modifying an interaction parameter of at least one polymer block of a block copolymer in at least another polymer block of a block copolymer. For example, the interaction parameter of the at least one polymer block in the at least another polymer block may be modified by changing a $\chi$ value of the block copolymer by modifying

TABLE 2

| Block Copolymer | PS-b-PDMS | PS-b-P4VP |
|---|---|---|
| $(A_n\text{-g-}(A'_m)_o)\text{-b-}B_p$ | A = styrene<br>A' = 4-hydroxystyrene grafted to short polydimethylsiloxane with ether bond<br>B = dimethylsiloxane | A = styrene<br>A' = 4-(bromomethyl)styrene grafted to hydroxy-terminated P4VP oligomers<br>B = 4-vinylpyridine |
| $A_n\text{-b-}(B_m\text{-g-}B'_o)_p$ | A = styrene<br>B = dimethylsiloxane<br>B' = dimethylsiloxane peroxide-cure grafted to the vinyl(dimethyl)siloxy ether of hydroxy-terminated polystyrene oligomers | A = polystyrene<br>B = 4-vinylpyridine<br>B' = 4-(azidomethyl)styrene unit linked to oligopolystyrene propynoate via Huisgen reaction |
| $(A_n\text{-g-}(A'_m)_o\text{-b-}(B_p\text{-g-}(B')_q)_r$ | A = styrene<br>A' = 4-hydroxystyrene grafted to short polydimethylsiloxane with ether bond<br>B = dimethylsiloxane<br>B' = dimethylsiloxane peroxide-cure grafted to the vinyl(dimethyl)siloxy ether of hydroxy-terminated polystyrene oligomers | A = styrene<br>A' = 4-(bromomethyl)styrene grafted to hydroxy-terminated P4VP oligomers<br>B = 4-vinylpyridine<br>B' = 4-(azidomethyl)styrene unit linked to oligopolystyrene propynoate via Huisgen reaction |
| $(A_n\text{-g-}(A'_m)_o)\text{-b-}B_p$ | A = styrene<br>A' = 4-hydroxystyrene grafted to short polydimethylsiloxane with ether bond<br>B = dimethylsiloxane | A = styrene<br>A' = 4-(bromomethyl)styrene grafted to hydroxy-terminated P4VP oligomers<br>B = 4-vinylpyridine |
| $A_n\text{-b-}(B_m\text{-g-}B'_o)_p$ | A = styrene<br>B = dimethylsiloxane<br>B' = dimethylsiloxane peroxide-cure grafted to the vinyl(dimethyl)siloxy ether of hydroxy-terminated polystyrene oligomers | A = styrene<br>B = 4-vinylpyridine<br>B' = 4-(azidomethyl)styrene unit linked to oligopolystyrene propynoate via Huisgen reaction |
| $(A_n\text{-g-}(A'_m)_o\text{-b-}(B_p\text{-g-}(B')_q)_r$ | A = styrene<br>A' = 4-hydroxystyrene grafted to short polydimethylsiloxane with ether bond<br>B = dimethylsiloxane<br>B' = dimethylsiloxane peroxide-cure grafted to the vinyl(dimethyl)siloxy ether of hydroxy-terminated polystyrene oligomers | A = styrene<br>A' = 4-(bromomethyl)styrene grafted to hydroxy-terminated P4VP oligomers<br>B = 4-vinylpyridine<br>B' = 4-(azidomethyl)styrene unit linked to oligopolystyrene propynoate via Huisgen reaction |

CONCLUSION

In some embodiments, the present disclosure includes a method of forming a block copolymer. The method may include modifying at least one of the plurality of polymer blocks of the block copolymer to change the $\chi$ value of the block copolymer. For example, the at least one of the plurality of polymer blocks of the block copolymer may be modified by polymerizing monomers thereof with a modifying monomer to decrease the $\chi$ value of the block copolymer. Additionally, the at least one of the plurality of polymer blocks of the at least one polymer block and the at least another polymer block. A length of time for the block copolymer to self-assemble into a plurality of microdomains may be decreased by changing the $\chi$ value of the block copolymer. A number of defects in a self-assembled film including microdomains of the at least one polymer block may be decreased by changing the $\chi$ value of the block copolymer. At least one modifying monomer may be incorporated into the at least one of the polymer block and the at least another polymer block.

At least one polymer segment may be grafted onto at least one of the at least one polymer block and the at least another polymer block.

In yet further embodiments, the present invention includes a method of forming a self-assembled block copolymer structure. At least one of a plurality of polymer blocks of a block copolymer may be modified to tailor a $\chi$ value of the block copolymer forming a modified block copolymer. The modified block copolymer material may be applied over a substrate and annealed to form a plurality of ordered domains, each comprising at least one of the plurality of polymer blocks. At least one modifying monomer may be incorporated into the at least one of the plurality of polymer blocks, the at least one modifying monomer changing the $\chi$ value of the block copolymer. At least one of a polymer segment and a chemical moiety may be grafted to the at least one of the plurality of polymer blocks, the at least one of the polymer segment and the chemical moiety changing the $\chi$ value of the block copolymer. At least one of the plurality of polymer blocks of a block copolymer may be selectively etchable with respect to at least another of the plurality of polymer blocks of the block copolymer.

In some embodiments, the present disclosure includes a block copolymer composition. The block copolymer composition may include a first polymer block comprising a plurality of styrene monomers and at least one of a plurality of 4-trimethylsiloxystyrene monomers and a second polymer block covalently linked to the first polymer block and comprising a plurality of dimethylsiloxane monomers. For example, at least one of the plurality of 4-trimethylsiloxystyrene monomers may be randomly distributed in the plurality of styrene monomers or the plurality of styrene monomers may alternate in succession with the at least one of the plurality of 4-hydroxystyrene monomers. The first monomer may further include a polydimethylsiloxane segment grafted to a hydroxyl group of at least one of the plurality of 4-hydroxystyrene monomers via an ether bond. As a non-limiting example, the second polymer block may further include a hydroxyl-terminated polystyrene oligomer grafted to at least one of the plurality of dimethylsiloxane monomers. The second monomer may further include phenyl(methyl)siloxane monomers randomly distributed in or alternating in succession with the plurality of dimethylsiloxane monomers. The first polymer block and the second polymer block may enable formation of a self-assembled structure in less than or equal to about four (4) hours. The first polymer block and the second polymer block may also enable formation of a self-assembled structure having an equilibrium defectivity of less than about 0.03 defects per $cm^2$.

In additional embodiments, the block copolymer composition of the present disclosure may include a first polymer block comprising a plurality of styrene monomers and a plurality of 4-hydroxystyrene monomers and a second polymer block covalently linked to the first polymer block and comprising a plurality of 4-vinylpyridine monomers. The plurality of styrene monomers may alternate in succession with the plurality of 4-hydroxystyrene monomers or the plurality of 4-hydroxystyrene monomers may be randomly distributed in the plurality of styrene monomers. The second polymer block further comprises a plurality of 2-vinylpyridine monomers alternating in succession with or randomly distributed in the plurality of 4-vinylpyridine monomers. By way of non-limiting example, the first polymer block may further include a 4-(bromomethyl) polystyrene segment grafted to at least one of the plurality of 4-vinylpyridine monomers. As non-limiting examples, the second polymer block may further include a plurality of 2-vinylpyridine monomers incorporated into the plurality of 4-vinylpyridine monomers and/or an oligopolystyrene propynoate segment grafted to at least one of a plurality of (azidomethyl)styrene monomers distributed in the plurality of 4-vinylpyridine monomers.

While the invention may be susceptible to various modifications and alternative fauns in implementation thereof, specific embodiments have been shown by way of example in the drawings and have been described in detail herein. However, it should be understood that the invention is not limited to the particular forms disclosed. Rather, the invention encompasses all modifications, variations and alternatives falling within the scope of the invention as defined by the following appended claims and their legal equivalents.

What is claimed is:

1. A method of forming a block copolymer, comprising grafting at least one modifying polymer segment onto at least one of a plurality of polymer blocks of a block copolymer to form a modified block copolymer having an $\chi N$ value between about 40 and about 135.

2. The method of claim 1, further comprising grafting at least one additional modifying polymer segment onto the modified block copolymer.

3. The method of claim 1, wherein grafting at least one modifying polymer segment onto at least one of the plurality of polymer blocks comprises grafting the at least one modifying polymer segment onto a polystyrene-b-polydimethylsiloxane block copolymer.

4. The method of claim 3, wherein grafting the at least one modifying polymer segment onto a polystyrene-b-polydimethylsiloxane block copolymer comprises grafting a polydimethylsiloxane block to at least one polystyrene block of the polystyrene-b-polydimethylsiloxane block copolymer.

5. The method of claim 3, wherein grafting the at least one modifying polymer segment onto a polystyrene-b-polydimethylsiloxane block copolymer comprises peroxide-cure grafting a vinyl(dimethyl)siloxy ether of a hydroxy-terminated polystyrene block to at least one polydimethylsiloxane block of the polystyrene-b-polydimethylsiloxane block copolymer.

6. The method of claim 1, wherein grafting the at least one modifying polymer segment onto at least one of a plurality of polymer blocks of a block copolymer comprises grafting the at least one modifying polymer segment to a polystyrene-b-poly(4-vinylpyridine) block copolymer.

7. The method of claim 6, wherein grafting the at least one modifying polymer segment onto a polystyrene-b-poly(4-vinylpyridine) block copolymer comprises grafting at least one polystyrene propynoate segment to a 4-(azidomethyl) styrene within at least one polystyrene block of the polystyrene-b-poly(4-vinylpyridine) block copolymer.

8. The method of claim 6, wherein grafting the at least one modifying polymer segment onto a polystyrene-b-poly(4-vinylpyridine) block copolymer comprises grafting a hydroxy-terminated poly(4-vinylpyridine) oligomer segment to a 4-(bromomethyl)styrene segment within at least one polystyrene block of the polystyrene-b-poly(4-vinylpyridine) block copolymer.

9. The method of claim 1, wherein grafting at least one modifying polymer segment onto at least one of a plurality of polymer blocks of a block copolymer comprises randomly distributing a plurality of modifying polymer segments onto the at least one of the plurality of polymer blocks.

10. A method of forming a self-assembled block copolymer structure, comprising:
    modifying at least one of a plurality of polymer blocks of a block copolymer to modify an $\chi$ value between at least two of the plurality of polymer blocks and form a modified block copolymer having an $\chi N$ value between about 40 and about 135;
applying the modified block copolymer over a substrate; and
annealing the modified block copolymer to form a plurality of ordered domains; wherein modifying at least one of a plurality of polymer blocks of a block copolymer to modify an $\chi$ value between at least two of the plurality of polymer blocks comprises chemically modifying a polystyrene block of at least one of a polystyrene-b-polydimethylsiloxane block copolymer and a polystyrene-b-poly(4-vinylpyridine) block copolymer.

11. A block copolymer composition, comprising:
a modified block copolymer having an $\chi N$ value between about 40 and about 135 and comprising:
 a first polymer block comprising:
  a plurality of styrene monomers; and
  a plurality of modifying monomers; and
 a second polymer block covalently linked to the first polymer block and comprising a plurality of monomers selected from the group consisting of dimethylsiloxane monomers and 4-vinylpyridine monomers.

12. The block copolymer composition of claim 11, wherein the plurality of modifying monomers comprises at least one of a plurality of siloxystyrene monomers, a plurality of hydroxystyrene monomers, and a plurality of silyl ether monomers.

13. The block copolymer composition of claim 11, wherein the plurality of modifying monomers comprises at least one of a plurality of 4-trimethylsiloxystyrene monomers, a plurality of hydroxystyrene monomers, and a plurality of trimethylsilyl ether monomers.

14. The block copolymer composition of claim 11, wherein the plurality of modifying monomers are randomly distributed in the plurality of styrene monomers.

15. The block copolymer composition of claim 11, wherein the plurality of styrene monomers alternate with the plurality of modifying monomers.

16. The block copolymer composition of claim 11, wherein the first polymer block further comprises at least one polymer segment grafted to at least one of the plurality of modifying monomers.

17. The block copolymer composition of claim 11, wherein the second polymer block further comprises another plurality of modifying monomers.

18. The block copolymer composition of claim 17, wherein the another plurality of modifying monomers are randomly distributed in the plurality of monomers.

19. The block copolymer composition of claim 17, wherein the plurality of modifying monomers alternate with the another plurality of modifying monomers.

* * * * *